United States Patent
Evelsizer et al.

(10) Patent No.: US 9,202,954 B2
(45) Date of Patent: Dec. 1, 2015

(54) NANOSTRUCTURE AND PHOTOVOLTAIC CELL IMPLEMENTING SAME

(75) Inventors: Vincent Evelsizer, Folsom, CA (US); Larry Bawden, El Dorado Hills, CA (US); John Fisher, Folsom, CA (US)

(73) Assignee: Q1 NANOSYSTEMS CORPORATION, Sacremento, CA (US)

( * ) Notice: Subject to any disclaimer, the term of this patent is extended or adjusted under 35 U.S.C. 154(b) by 1109 days.

(21) Appl. No.: 13/039,208

(22) Filed: Mar. 2, 2011

(65) Prior Publication Data

US 2011/0214709 A1  Sep. 8, 2011

Related U.S. Application Data

(60) Provisional application No. 61/310,227, filed on Mar. 3, 2010.

(51) Int. Cl.
| | |
|---|---|
| *H01L 31/18* | (2006.01) |
| *H01L 31/072* | (2012.01) |
| *H01L 31/073* | (2012.01) |
| *H01L 31/0352* | (2006.01) |
| *H01L 29/06* | (2006.01) |
| *H01L 21/02* | (2006.01) |

(52) U.S. Cl.
CPC ...... *H01L 31/035227* (2013.01); *H01L 31/072* (2013.01); *H01L 31/073* (2013.01); *H01L 21/02603* (2013.01); *H01L 29/0665* (2013.01); *H01L 29/0673* (2013.01); *H01L 31/18* (2013.01); *Y02B 10/12* (2013.01); *Y02B 10/14* (2013.01); *Y02E 10/543* (2013.01)

(58) Field of Classification Search
CPC .. B82Y 30/00; H01L 31/0232; H01L 31/055; H01L 31/0352; H01L 31/0676; H01L 31/18; H01L 29/0665; H01L 29/0673; H01L 21/02603; H01L 31/022466; H01L 31/035227; H01L 31/035281; H01L 31/1884; H01L 31/03529; H01L 31/072; H01L 31/073; Y02E 10/50; Y02E 10/52; Y02E 10/543; Y02B 10/12; Y02B 10/14
USPC .......................................... 136/252, 255, 256
See application file for complete search history.

(56) References Cited

U.S. PATENT DOCUMENTS

| | | | |
|---|---|---|---|
| 3,150,999 | A | 9/1964 | Rudenberg et al. |
| 4,099,986 | A | 7/1978 | Diepers |
| RE29,833 | E | 11/1978 | Mlavsky |

(Continued)

FOREIGN PATENT DOCUMENTS

| | | |
|---|---|---|
| CN | 1855552 A | 11/2006 |
| EP | 1 703 569 A2 | 9/2006 |

(Continued)

OTHER PUBLICATIONS

PCT International Preliminary Report on Patentability from application No. PCT/US2010/039552 dated Jan. 12, 2012.

(Continued)

*Primary Examiner* — Jayne Mershon
*Assistant Examiner* — Mayla Gonzalez Ramos
(74) *Attorney, Agent, or Firm* — The Marbury Law Group, PLLC

(57) ABSTRACT

Nanostructures and photovoltaic structures are disclosed. Methods for creating nanostructures are also presented.

19 Claims, 17 Drawing Sheets

(56) References Cited

U.S. PATENT DOCUMENTS

| | | | |
|---|---|---|---|
| 4,234,352 A | 11/1980 | Swanson | |
| 4,454,372 A | 6/1984 | Appleby | |
| 4,816,082 A | 3/1989 | Guha et al. | |
| 5,178,685 A | 1/1993 | Borenstein et al. | |
| 5,238,519 A | 8/1993 | Nath et al. | |
| 5,371,470 A | 12/1994 | Jeng | |
| 5,476,553 A | 12/1995 | Hanoka et al. | |
| 5,916,375 A | 6/1999 | Agui et al. | |
| 5,928,439 A | 7/1999 | Ota et al. | |
| 5,994,164 A * | 11/1999 | Fonash et al. | 438/97 |
| 6,033,928 A | 3/2000 | Eriguchi et al. | |
| 6,087,197 A | 7/2000 | Eriguchi et al. | |
| 6,337,283 B1 | 1/2002 | Verlinden et al. | |
| 6,372,538 B1 | 4/2002 | Wendt et al. | |
| 6,372,980 B1 | 4/2002 | Freundlich | |
| 6,383,923 B1 | 5/2002 | Brown et al. | |
| 6,423,568 B1 | 7/2002 | Verlinden et al. | |
| 6,448,105 B1 | 9/2002 | Sterk | |
| 6,468,828 B1 | 10/2002 | Glatfelter et al. | |
| 6,518,494 B1 | 2/2003 | Shibuya et al. | |
| 6,548,751 B2 | 4/2003 | Sverdrup, Jr. et al. | |
| 6,559,479 B1 | 5/2003 | Ludemann | |
| 6,583,349 B2 | 6/2003 | Tanaka | |
| 6,620,996 B2 | 9/2003 | Sugawara et al. | |
| 6,638,823 B2 | 10/2003 | Cho et al. | |
| 6,660,930 B1 | 12/2003 | Gonsiorawski | |
| 6,852,920 B2 | 2/2005 | Sager et al. | |
| 6,872,450 B2 | 3/2005 | Liu et al. | |
| 6,872,645 B2 | 3/2005 | Duan et al. | |
| 6,878,871 B2 * | 4/2005 | Scher et al. | 136/252 |
| 6,882,051 B2 | 4/2005 | Majumdar et al. | |
| 6,946,597 B2 | 9/2005 | Sager et al. | |
| 7,051,945 B2 | 5/2006 | Empedocles et al. | |
| 7,064,372 B2 | 6/2006 | Duan et al. | |
| 7,067,867 B2 | 6/2006 | Duan et al. | |
| 7,083,104 B1 | 8/2006 | Empedocles et al. | |
| 7,135,350 B1 | 11/2006 | Smith et al. | |
| 7,253,017 B1 | 8/2007 | Roscheisen et al. | |
| 7,589,880 B2 | 9/2009 | Kempa et al. | |
| 7,649,665 B2 | 1/2010 | Kempa et al. | |
| 7,754,964 B2 | 7/2010 | Kempa et al. | |
| 7,847,180 B2 | 12/2010 | Argo et al. | |
| 7,943,847 B2 | 5/2011 | Kempa et al. | |
| 2002/0011641 A1 | 1/2002 | Oswald et al. | |
| 2002/0130311 A1 | 9/2002 | Lieber et al. | |
| 2002/0175408 A1 | 11/2002 | Majumdar et al. | |
| 2003/0041894 A1 | 3/2003 | Sverdrup, Jr. et al. | |
| 2004/0018525 A1 | 1/2004 | Wirtz et al. | |
| 2004/0025933 A1 | 2/2004 | Chittibabu et al. | |
| 2004/0025934 A1 | 2/2004 | Chittibabu et al. | |
| 2004/0060591 A1 | 4/2004 | Den | |
| 2004/0063320 A1 | 4/2004 | Hollars | |
| 2004/0075464 A1 | 4/2004 | Samuelson et al. | |
| 2004/0123896 A1 | 7/2004 | Lemmon et al. | |
| 2004/0144420 A1 | 7/2004 | Takeyama et al. | |
| 2004/0144985 A1 | 7/2004 | Zhang et al. | |
| 2004/0146560 A1 | 7/2004 | Whiteford et al. | |
| 2004/0250848 A1 | 12/2004 | Sager et al. | |
| 2005/0040374 A1 | 2/2005 | Chittibabu et al. | |
| 2005/0079659 A1 | 4/2005 | Duan et al. | |
| 2005/0098204 A1 | 5/2005 | Roscheisen et al. | |
| 2005/0098205 A1 | 5/2005 | Roscheisen et al. | |
| 2005/0121068 A1 | 6/2005 | Sager et al. | |
| 2005/0126628 A1 | 6/2005 | Scher et al. | |
| 2005/0161662 A1 | 7/2005 | Majumdar et al. | |
| 2005/0181587 A1 | 8/2005 | Duan et al. | |
| 2005/0189015 A1 | 9/2005 | Rohatgi et al. | |
| 2005/0217717 A1 | 10/2005 | Faris | |
| 2005/0224790 A1 | 10/2005 | Jin et al. | |
| 2006/0006463 A1 | 1/2006 | Islam et al. | |
| 2006/0024438 A1 | 2/2006 | Ku et al. | |
| 2006/0038182 A1 | 2/2006 | Rogers et al. | |
| 2006/0151820 A1 | 7/2006 | Duan et al. | |
| 2006/0207647 A1 | 9/2006 | Tsakalakos et al. | |
| 2007/0029561 A1 | 2/2007 | Cho et al. | |
| 2007/0036951 A1 | 2/2007 | Nguyen et al. | |
| 2007/0137697 A1 | 6/2007 | Kempa et al. | |
| 2007/0235714 A1 | 10/2007 | Kwon et al. | |
| 2007/0240757 A1 | 10/2007 | Ren et al. | |
| 2008/0202581 A1 | 8/2008 | Kempa | |
| 2008/0251122 A1 | 10/2008 | Ready | |
| 2009/0007956 A1 | 1/2009 | Kempa et al. | |
| 2009/0211637 A1 | 8/2009 | Eaglesham | |
| 2009/0250105 A1 | 10/2009 | Lee | |
| 2010/0112748 A1 | 5/2010 | Vidu et al. | |
| 2010/0319759 A1 | 12/2010 | Fisher et al. | |
| 2011/0036395 A1 | 2/2011 | Argo et al. | |
| 2011/0308564 A1 | 12/2011 | Kempa et al. | |

FOREIGN PATENT DOCUMENTS

| | | |
|---|---|---|
| JP | 53-31987 | 3/1978 |
| JP | 3-151672 | 6/1991 |
| JP | 4-296060 | 10/1992 |
| JP | 6-104463 | 4/1994 |
| JP | 6-342924 | 12/1994 |
| JP | 9-118511 | 5/1997 |
| JP | 2006/261666 A2 | 9/2006 |
| JP | 2009-507397 A | 2/2009 |
| WO | 2004/044948 A2 | 5/2004 |
| WO | 2007/040594 A2 | 4/2007 |
| WO | 2008/048232 A2 | 4/2008 |
| WO | 2008/048233 A2 | 4/2008 |
| WO | WO 2008048232 A2 * | 4/2008 |
| WO | 2010/151556 A1 | 12/2010 |

OTHER PUBLICATIONS

"Konarka: Vision and Mission" 2011 Konarka Technologies, Inc., www.konarkatech.com/about/, 2 pages.

Glaeser, Andreas M., "Model studies of Rayleigh instabilities via microdesigned interfaces," Lawrence Berkeley National Laboratory, Oct. 17, 2000, 39 pages.

Non-Final Office Action Summary from U.S. Appl. No. 12/508,815 dated Nov. 10, 2011.

Karpov et al., "Physics of CdTe Photovoltaics: From Front to Back," Invited talk F10.1, MRS Spring Meeting 2005, Mar. 28-Apr. 1, San Francisco, CA, pp. 1-12.

Solar Electrical System Sizing Sheet, Go Solar®, www.solarexpert.com/Pvinsolation.html, downloaded Mar. 2, 2011.

Restriction Requirement from U.S. Appl. No. 11/466,411 dated Jun. 24, 2009.

Restriction Requirement from U.S. Appl. No. 11/466,411 dated Nov. 9, 2009.

Non-Final Office Action Summary from U.S. Appl. No. 11/466,411 dated Nov. 27, 2009.

Rumpler, Jr., "Optoelectric Integration Using the Magnetically Assisted Statistical Assembly Technique: Initial Magnetic Characterization and Process Development," MIT Thesis, Department of Electrical Engineering and Computer Science, Sep. 5, 2002, 102 pages.

Final Office Action Summary from U.S. Appl. No. 11/466,411 dated Jun. 8, 2010.

Sharma et al., "Diameter control of Ti-catalyzed silicon nanowires," 2004 Elsevier B.V., Journal of Crystal Growth, vol. 267, www.sciencedirect.com, pp. 613-618.

Notice of Allowance and Fee(s) Due from U.S. Appl. No. 11/466,411 dated Oct. 6, 2010.

Zhang et al., "Coaxial Nanocable: Silicon Carbide and Silicon Oxide Sheathed with Boron Nitride and Carbon," Science, vol. 281, No. 11, Aug. 14, 1998, www.sciencemag.org, pp. 973-975, Washington, DC, USA.

Gaire et al., "Mechanical Testing of Isolated Amorphous Silicon Slanted Nanorods," 2005 American Scientific Publishers, Journal of Nanoscience and Nanotechnology, vol. 5, 2005, pp. 1893-1897, USA.

Kayes et al., "Synthesis and Characterization on Silicon Nanorod Arrays for Solar Cell Applications," Cal Tech Disclosure, May 19, 2006, pp. 1-4.

(56) References Cited

OTHER PUBLICATIONS

Kayes et al., "Comparison of the device physics principles of planar and radial p-n junction nanorod solar cells," May 23, 2005 American Institute of Physics, Journal of Applied Physics, vol. 97, pp. 114302/1-114302/11.
Kayes, "Radial P-N Junction Nanorod Solar Cells," Applied Physics Candidacy Presentation, Sep. 7, 2004, pp. 1-32.
International Search Report and Written Opinion from PCT Application No. PCT/US06/32987 dated Jul. 18, 2008.
International Preliminary Report on Patentability from PCT Application No. PCT/US06/32987 dated Jul. 22, 2009.
U.S. Appl. No. 11/466,416, filed Aug. 22, 2006.
Restriction Requirement from U.S. Appl. No. 11/466,416 dated Aug. 5, 2009.
Final Office Action Summary from U.S. Appl. No. 11/466,416 dated May 26, 2010.
Non-Final Office Action Summary from U.S. Appl. No. 11/466,416 dated Dec. 9, 2009.
PeriodicTable.com, Technical Data for Gold, available at http://www.periodictable.com/Elements/079/data.html, last visited Nov. 18, 2009.
PeriodicTable.com, Technical Data for Tellurium, available at http://www.periodictable.com/Elements/052/data.html, last visited Nov. 18, 2009.
Encyclopedia Britannica, Shear Modulus, available at http://www.britannica.com.EBchecked/topic/539275/shear-modulus, last visted Nov. 18, 2009.
Stroeve et al., "Fabrication of Nanocables by Electrochemical Deposition Inside Metal Nanotubes," 2004 American Chemical Society, J. Am. Chem. Soc., 2004, vol. 126, pp. 15022-15023.
Stroeve et al., "Modeling Electrochemical Deposition Inside Nanotubes to Obtain Metal-Semiconductor Multiscale Nanocables or Concial Nanopores," 2005 American Chemical Society, Journal of Phys. Chem. B., Jun. 7, 2005, vol. 109, pp. 14523-14528.
Xia et al., "Ag Nanowires Coated with Ag/Pd Alloy Sheaths and Their Use As Substrates for Reversible Absorption and Desportion of Hydrogen," Journal of American Chemical Society, vol. 126, Apr. 21, 2004, pp. 5940-5941.
PeriodicTable.com, Technical Data for Silver, available at http://www.periodictable.com/Elements/047/data.html, last visited Nov. 18, 2009.
PeriodicTable.com, Technical Data for Palladium, available at http://www.periodictable.com/Elements/046/data.html, last visited Nov. 18, 2009.
Non-Final Office Action Summary from U.S. Appl. No. 11/466,416 dated Dec. 23, 2010.
International Search Report and Written Opinion from PCT Application No. PCT/US06/32986 dated Sep. 10, 2008.
Peng et al., "Aligned Single-Crystalline Si Nanowire Arrays for Photovoltaic Applications," 2005 Wiley-VCH Verlag GmbH & Co., Small, vol. 1, No. 11, 2005, www.small-journal.com, pp. 1062-1067.
PCT International Preliminary Report on Patentability from PCT Application No. PCT/US06/32986 dated Jul. 22, 2009.
International Search Report and Written Opinion from PCT Application No. PCT/US2010/039552 dated Aug. 18, 2010.
PCT Application No. PCT/US11/27066 filed on Mar. 3, 2011.
Darius Snieckus; "A different dimension"; US Solar, Innovation; www.rechargenews.com; Feb. 4, 2011.
Indium Tin Oxide; Material Property Database; http://www.mit.edu/~6.777/matprops/ito.htm; accessed May 14, 2014.
John David Jackson; Professor of Physics, University of Illinois; Classical Electrodynamics; John Wiley & Sons, Inc.1998.
Optical Constants of IN O—SnO (ITO, Indium Tin Oxide); Refractive index of In2O3—SnO2 (ITO, Indium tin oxide) [Crystals etc.]—Refractive Index Info; http://refractiveindex.info/legacy/?group=CRYSTALS&material=ITO; accessed on May 14, 2014.
Optical Constants of ZnO (Zinc Oxide); Refractive index of IZnO (Zinc Oxide) [Crystals etc.]—Refractive Index Info; http://refractiveindex.info/legacy/?group=CRYSTALS&material=ZnO; accessed on May 14, 2014.
Jeong-Eun Kim et al.; Electrical and Optical Properties of Zinc Oxide Thin Films Deposited Using Atomic Layers Deposition; Journal of the Korean Ceramic Society; vol. 47, No. 4, pp. 353-356; 2010.
Final Office Action Summary from U.S. Appl. No. 12/508,815 dated May 30, 2012.
Final Office Action Summary from U.S. Appl. No. 11/466,416 dated May 26, 2011.
Restriction/Election Requirement from U.S. Appl. No. 12/508,815 dated Aug. 2, 2011.
Restriction Requirement from U.S. Appl. No. 12/911,657 dated Sep. 1, 2011.
Office Action Summary from Japanese Application No. 2008-540018 dated Oct. 4, 2011(no translation).
Office Action Summary from Japanese Application No. 2008-540017 dated Sep. 27, 2011 (no translation).
U.S. Appl. No. 13/289,979, filed Nov. 4, 2011.
U.S. Appl. No. 13/289,968, filed Nov. 4, 2011.
Non-Final Office Action Summary from U.S. Appl. No. 12/911,657 dated Feb. 6, 2012.
Non-Final Office Action Summary from U.S. Appl. No. 11/466,416 dated Feb. 17, 2012.
Kayes et al., "Radial PN Junction Nanorod Solar Cells: Device Physics Principles and Routes to Fabrication in Silicon," Photovoltaic Specialists Conference, Aug. 8, 2005.
Japanese Office Action issued in JP Application No. 2012-556244, mailed Aug. 5, 2014.
Extended European Search Report Issued by the European Patent Office for European Application No. 15152034.3 on May 12, 2015.

* cited by examiner

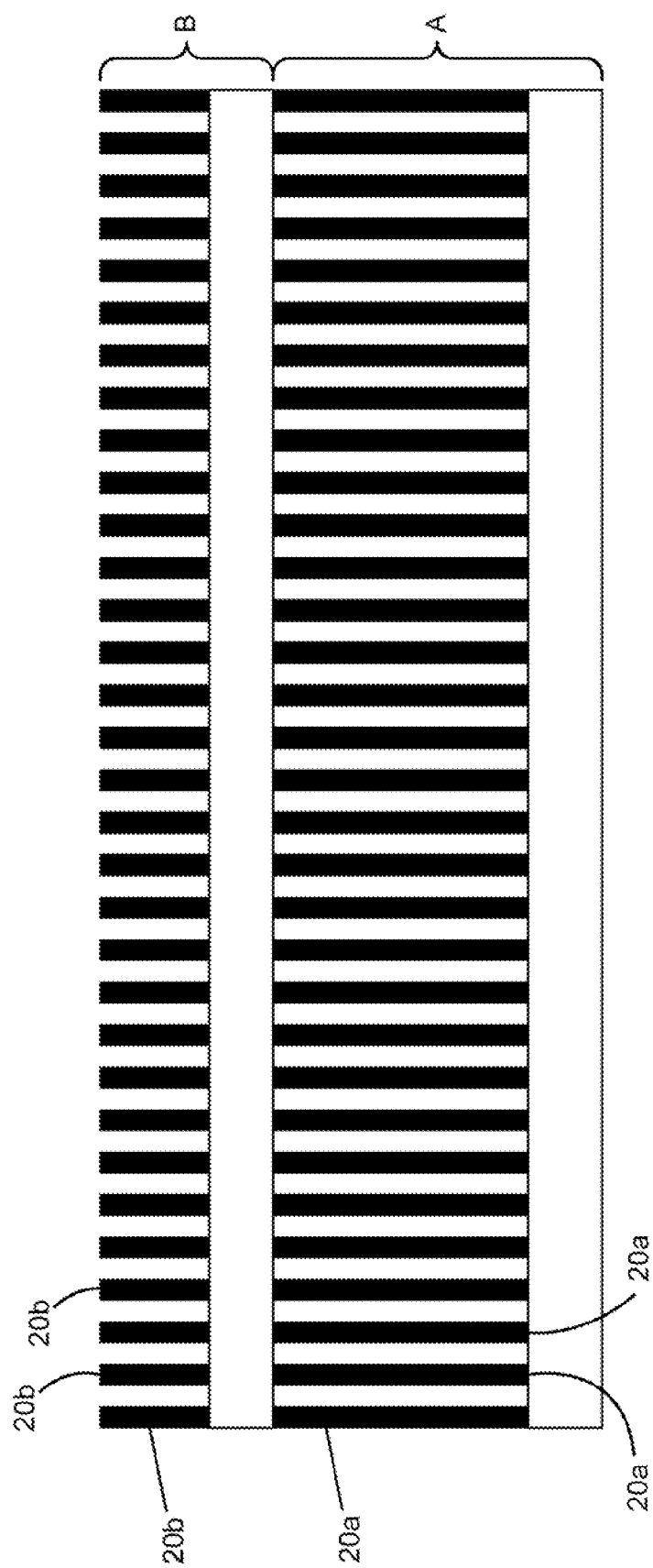

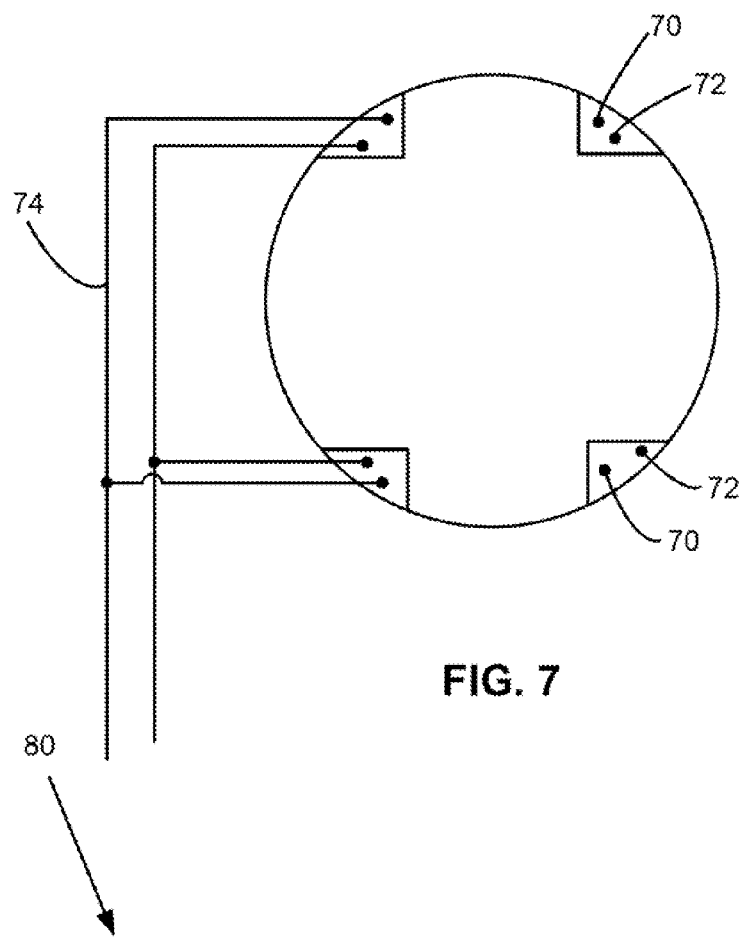

NANOSTRUCTURE AND PHOTOVOLTAIC CELL IMPLEMENTING SAME

RELATED APPLICATIONS

This application claims priority to U.S. Provisional Patent Application No. 61/310,227 entitled "NANOSTRUCTURE AND PHOTOVOLTAIC CELL IMPLEMENTING SAME", filed Mar. 3, 2010, and which is herein incorporated by reference.

FIELD OF INVENTION

This invention pertains generally to nanotechnology and more particularly to nano-scale structures and processes for making these structures.

BACKGROUND

Solar panels that harness solar energy and convert it to electrical energy are well known. A typical solar electricity system includes the following components: solar panels, charge controller, inverter, and often batteries. A typical solar panel, often referred to as a photovoltaic (PV) module, consists of a one or more interconnected PV cells environmentally sealed in protective packaging consisting of a glass cover and extruded aluminum casing.

The PV cell may be a p-n junction diode capable of generating electricity in the presence of sunlight. It is often made of crystalline silicon (e.g., polycrystalline silicon) doped with elements from either group 13 (group III) or group 15 (group V) on the periodic table. When these dopant atoms are added to the silicon, they take the place of silicon atoms in the crystalline lattice and bond with the neighboring silicon atoms in almost the same way as the silicon atom that was originally there. However, because these dopants do not have the same number of valence electrons as silicon atoms, extra electrons or "holes" become present in the crystal lattice. Upon absorbing a photon that carries an energy that is at least the same as the band gap energy of the silicon, the electrons become free. The electrons and holes freely move around within the solid silicon material, making silicon conductive. The closer the absorption event is to the p-n junction, the greater the mobility of the electron-hole pair.

When a photon that has less energy than silicon's band gap energy strikes the crystalline structure, the electrons and holes are not mobilized. Instead of the photon's energy becoming absorbed by the electrons and holes, the difference between the amount of energy carried by the photon and the band gap energy is converted to heat.

While the idea of converting solar energy to electrical power has much appeal, conventional solar panels have limited usage because their efficiencies are generally only in the range of 15% and are manufactured using costly silicon wafer manufacturing processes and materials. This low efficiency is due in part to the planar configuration of current PV cells, as well as the relatively large distances between the electrodes and the P-N junction. Low efficiency means that larger and heavier arrays are needed to obtain a certain amount of electricity, raising the cost of a solar panel and limiting its use to large-scale structures.

The most common material for solar cells is silicon. Crystalline silicon comes in three categories: single-crystal silicon, polycrystalline silicon, and ribbon silicon. Solar cells made with single or monocrystalline wafers have the highest efficiency of the three, at about 20%. Unfortunately, single crystal cells are expensive and round so they do not completely tile a module. Polycrystalline silicon is made from cast ingots. They are made by filling a large crucible with molten silicon and carefully cooling and solidifying them. The polycrystalline silicon is less expensive than single crystal, but is only about 10-14% efficient depending on the process conditions and resulting imperfections in the material. Ribbon silicon is the last major category of PV grade silicon. It is formed by drawing flat, thin films from molten silicon, and has a polycrystalline structure. Silicon ribbon's efficiency range of 11-13% is also lower than monocrystalline silicon due to more imperfections. Most of these technologies are based on wafers about 300 µm thick. The PV cells are fabricated then soldered together to form a module.

Another technology under development is multijunction solar cells, which is expected to deliver less than 18.5% efficiency in actual use. The process and materials to produce multijunction cells are enormously expensive. Those cells require multiple gallium/indium/arsenide layers. The best is believed to be a sextuple-junction cell. Current multijunction cells cannot be made economical for large-scale applications A promising enabler of PV cells and other technology is nanotechnology. However, one problem with implementing nanotechnology is that the minute conductors may not be able to withstand their own formation, much less subsequent processing conditions or conditions of use in the end product. For example, the metal forming the nanoconductors may be soft, making it prone to bending or breaking during application of additional layers.

Further, it has heretofore proven difficult and even impossible to create nanoarrays having structures of uniform size and/or spacing.

Thus, as alluded to, the technology available to create PV cells and other electronic structures is limited to some extent by processing limitations as well as the sheer fragileness of the structures themselves.

Therefore, it would be desirable to enable creation of nanostructures having high aspect ratios and yet are durable enough for practical use in industry.

it would also be desirable to enable fabrication of a solar cell that has a higher than average efficiency, and in some embodiments, higher than about 30%.

BRIEF DESCRIPTION OF THE DRAWINGS

FIGS. 3A and 3B are cross-sectional views of embodiments of the solar brush having a layered structure.

FIG. 7 illustrates a photovoltaic array and lead frame according to one embodiment.

FIG. 8 depicts a method according to one embodiment.

DETAILED DESCRIPTION

Figure 1:
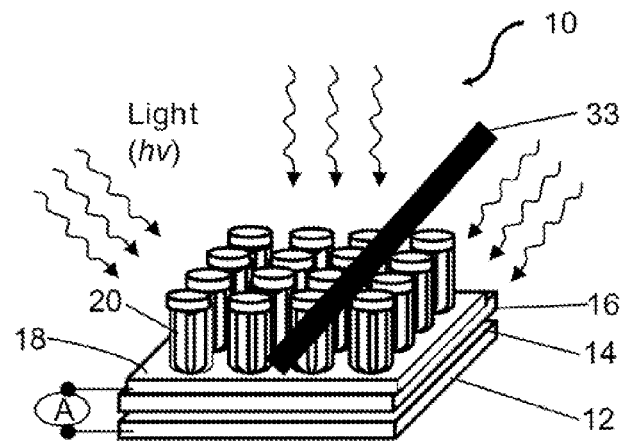
FIG. 1 is a perspective view of an exemplary solar brush that may be used to implement solar panels with improved efficiency.

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each and any of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Various embodiments of the invention are described herein in the context of solar cells. However, it is to be understood that the particular application provided herein is just an exemplary application, and the nanocable arrangements of the various embodiments of the present invention are not limited to the application or the embodiments disclosed herein.

This disclosure also relates to nano arrays of thin film solar cells. Solar modules constructed using thin film systems tend to use a single larger single plane thin films solar cell, rather than an array of smaller interconnected nano-scale solar cells. The entire module can use a laser scribe to mark individual cells. It is important to note that nano systems may be processed differently than current technology thin films. Four main thin film material system types are amorphous silicon (A-Si), copper indium selenide ($CuInSe_2$ commonly referred to as CIS), copper indium gallium selenide ($CuIn_xGa_{1-x}Se_x$) commonly referred to as CIGS), and CdTe/CdS. A-Si films are typically fabricated using plasma enhanced chemical vapor deposition (PE-CVD).

The term "nanocable" denotes any elongated body whose one dimension (e.g. diameter or width) is of nano or micro scale or size and the other dimension is larger, potentially much larger. A "nanostructure" may include one or more nanocables. A nanocable may be fabricated with dissimilar materials, either as a core rod or wire that is laterally enveloped by one or more layers of material(s), as a nanotube that is filled with one or more layers of material(s), as a single structure of one material, etc. Nanocables are also referred as nanotubes, nanorods, nanowires, filled nanotubes and bristles. The functional element of the nanocable in each case is the interface(s) between the two (or more) materials. In various alternative configurations and modes of growth, a succession of layers of different materials, alternating materials or different thicknesses of materials can be deposited to form nested layer nanocables.

The term "photovoltaically active p-n junction" denotes any p-n junction with an adequate p-layer and n-layer thickness to generate electricity.

FIG. 1 is a perspective view of an exemplary solar brush 10 that may be used to implement solar cells with improved efficiency. As shown, the solar brush 10 has a substrate 12, a first conductive layer 14, an insulator layer 16, a second conductive layer 18, and a plurality of bristles 20. Although the bristles 20 are shown to be cylindrically-shaped in the particular embodiment, they may be of any other shape including but not limited to cones, rectangular, domes, or more complex geometries such as branched bristles, elongated ovals, elongated rectangles, elongated polygons etc. Each of the bristles 20 has a nanocable extending through its center, and layers of semiconductor around the nano or micro cable. The nano or micro cable can be thin relative to the PV coating. In that case, the bristles may be slightly reflective but mostly transparent. There can also be diffraction that will help distribute light throughout the cell. Alternatively, the bristles can be very thick relative to the photovoltaic coating; that is to say that the bristles could be at micro scale and the coating could be at the nano scale. In that case, diffraction and reflections still distribute light throughout the device. Bristles may protrude vertically from the substrate or may protrude at angles. Bristles protruding at angles may increase the amount of semiconductor materials exposed to the sun when the sun is directly overhead and may improve internal reflections.

Bristle angles can be created by heating a polymer membrane and creating an asymmetric drag to get a template with tilted apertures into which a material may be formed, e.g., by electroplating. Deformation of the template may be done by having a heat source, a source of drag, and an optional cooling source. One example would be a doctor blade scraping the heated top of a polymer membrane while the substrate is cooled with a cooling block or cool air or water. A heated air knife could be used to replace the doctor blade. This also could be done with two contact rolls where one roll is cooled and moving at slow speed and roll is heated and moving at a slightly faster speed. Additionally, seeding processes/vapor processes can be used on tilted surfaces to grow nanowire arrays at angles. Various shapes can be obtained using asymmetric pore membranes. One or more electrically conductive strips 33 may extend across the array or portion thereof to assist in carrying electricity away from the array, thereby improving the overall efficiency of the brush. The efficiency gains are more pronounced in larger arrays. Such strips 32 are preferably very thin to block minimal light.

Figure 2:
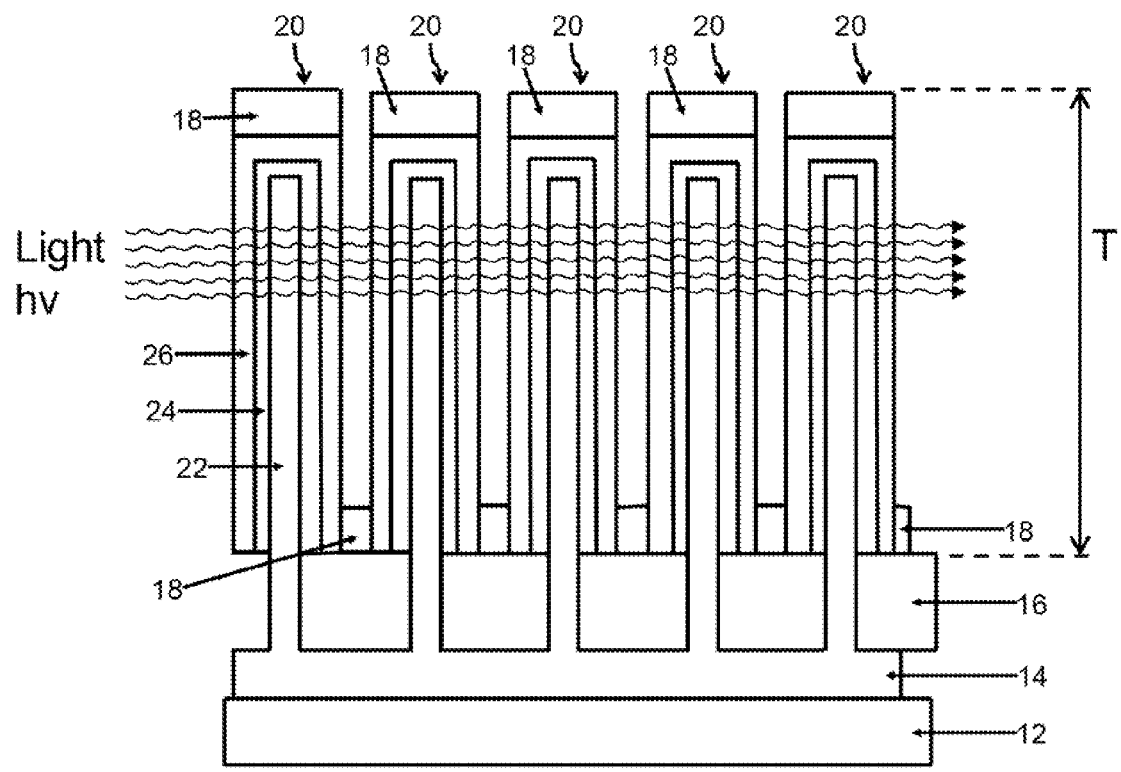
FIG. 2 is a side cross-section of the solar brush.

FIG. 2 is a side cross-section of the solar brush 10 with a metal nanocable. As shown, each of the bristles 20 has a nanocable 22 extending through its core. The nanocable 22 is typically a metal conductor, and extends through the insulating layer 16 to electrically connect with the first conductive layer 14. A p-type semiconductive layer 24 of a sufficient thickness surrounds the nanocable 22, and an n-type semiconductive layer 26 of sufficient thickness is coated on the p-type semiconductive layer 24 to create a photovoltaically active p-n junction in each of the bristles 20. A conductor is deposited on the bristles 20 and the insulating layer 16 to form the second conductive layer 18. As shown, the second conductive layer may reside on tops of the bristles 20. However, the second conductive layer 18 may have any desirable configuration. In other approaches, the second conductive layer 18 overlies a majority, and ideally, all of the bristles. See, for example, the upper conductive layer 58 of FIG. 6H. The conductive layer 18 can be segmented so that a short in a small section of the cell would not affect neighboring portions of the PV cell. Sections could be individually tested with only good portions of the device bussed together. The segmented areas of conductive layer 18 could also me bussed prior to plating such that energy could be delivered to one part of the array and not others. By switching segments on and off, two or more different materials could be plated on different portions of the array. The segmentation could bus not only individual rows, but with patterning techniques to those skilled in the art one bus every other bristle in a basket weave type design, or any other possible division of bristles. There can be any number of materials electroplated in the basket weave design, and moreover bristles can be optimized to PV thicknesses or material types which are especially suited for parts of the spectrum.

In addition to modifying the back contact from the conductive base, the bristles themselves can also be modified with materials that can serve as improved back contacts. Such materials include Sn, An, Cu, C, Sb, Au, Te polymers, metal oxides, Si, $SiO_2$, S, NiO, $Ni_2O_5$, $NiS_2$, Zn, $Sb_2Te_3$, Ni, $NiTe_2$, Si, $SiO_2$, Cu, Ag, Au, Mo, Al and Te/C or combinations thereof. One could perform electrochemical deposition (ECD) of the nano or micro cables with an alloy of Ni and Cu. The alloying could minimize the diffusion of Cu during the heat activation step. One could also ECD coat a thin layer of Te on top of the alloyed nano or micro cable as a diffusion barrier. Nickel can be etched with a 10% HCl solution. With that clean layer, $CuSO_4$ solution could be applied and heat treated to cause Cu diffusion into the nano or micro rod prior to plating. Varying degrees of oxides such as $SiO_2$ can also be added to the microrod surface effect modify the plated composition.

In a further approach, a thin metal oxide layer may be formed or allowed to remain over the metal contact, e.g., Ni layer, to create a diffusion barrier to the lower metal contact electron back barrier height and the overlying PV materials. Generally, one would expect an oxide layer to detrimentally affect performance by creating too much electrical resistance for proper operation of the array. Surprisingly, and counter to conventional wisdom, such an oxide layer was formed in an experiment, and was found not to cause an overly-detrimental effect on electric performance of the array. In the experiment, a thin layer of $Ni_xO_y$ formed on the Ni lower contact due to exposure to oxygen. A CdTe layer was formed thereover. Surprisingly, the array functioned well. Moreover, it was found that the layer of $Ni_xO_y$ beneficially prevented diffusion of the Ni into the CdTe layer. Accordingly, in some embodiments, a layer of metal oxide may be formed between the lower contact and the PV materials. Such layer of metal oxide may be formed, e.g., by exposing the lower contact to an oxygen-containing environment (e.g., air, ozone rich atmosphere, etc.) preferably while being heated (e.g., to >100° C.); barrel ashing; etc.

The closer the photon absorption event is to the p-n junction, the more likely the event will result in usable electricity. In the case of a nanobrush, a reflective back contacting layer is not required because the photon can continue along the linear path so that it can contact the material on the opposite side of the cell thereby achieving a double pass in each nanobristle. In FIG. 2, five cylindrical shell solar brush PV cells are shown. Thus, if the photon passes slightly off-center of the shell it has the potential to come into contact with as many as the equivalent of 10 p-type layers (the layer where the solar event takes place) in this brush design. If the p-layer conductor is sufficiently small most of the photons will pass through five thicker layers. In the actual case, the solar brush, with millions of bristles per $cm^2$, would effectively approach the efficiency of 100% of all usable photon energy. Without being constrained to any particular theory some light that was previously considered unusable could excite electrons in a stream where reflected light has an additive effect so that the addition of two photons with less than the band gap of energy can create an additive effect that ejects the electrons from the PV material.

The substrate 12 may be a conductive material or a non-conductive material (coated with a conductive material), rigid or flexible. For example, the substrate 12 could be glass, doped silicon, diamond, metal, polymer, ceramics, or a variety of composite materials. Thin metal foil or certain polymers can be used where flexibility is desired. Flexible materials can be processed by vacuum attaching them to a structure that has the correct dimensions or flatness during the process. Structural integrity of the nanocable will vary with material choices. In the case of brittle or easily deformable bristles, a flexible substrate material could be used if attached to a rigid or semi-rigid surface. The molded surface/flexible membrane may be of particular help when PV cells are desired for an aerodynamic surface such as an airplane part, the roof of a car, the surface of other vessels or portable devices. Adequately, thin metals may also be used and plated using a semi continuous reel to reel plating. In such systems degrease, positive electropolish, negative electropolish, electrochemical depositions made semicontuous via dancer rollers, rinse and drying operations are all feasible in this case. One advantage to such a system is a formation of a semiflexible matt analogous to a window blind.

Moreover, the continuous nature of such an array allows one to tailor a power output of the array to meet specific needs, rather than the current approach of providing a number of modular arrays to achieve at least the desired power output, and in most instances, more than needed. The approach may be achieved by any number of techniques such as cutting the array to a size that provides the desired power output, forming the array with characteristics tailored to the specific parameters desired, etc. For example, assume a customer needs a 20 kW output. If each 1-inch band of array provides 5 kW, a four inch section would be provided.

Each of the bristles 20 is a discrete nanoscale PV cell. Compared to conventional flat PV cells design where only a single "xy" planar surface is exposed to light, the solar brush 10 has a "xyz" or a three-dimensional surface. Thus, for a given volume, the solar brush 10 has a useful surface area that can be several times to tens of times (or more) greater than the "xy" surface area of conventional PV cells. The area between solar bristles 20 could be sufficiently wide as to make the brush absorptive to the majority of photons. Additionally, the bristles may be thin enough to be partially transparent. This effective transparency and bristle spacing would increase effective energy generation to happen from sunrise to sunset while flat PV cells work optimally when the sun is straight above the PV surface. Because the effective energy generation from the solar brush is expected to be many times higher than conventional PV cell technology, the weight per kilowatt generated would be many times lower. The thickness of the PV material is as important as the height and the spacing of the bristles. If the materials are sufficiently thin, electron-hole recombination minimizes damage cell efficiency, and up to a 15% gain above that of 29% theoretical efficiency of a single junction cell becomes possible. This would allow use in small applications such as charging electronic devices (cell phone, computer, PDA, etc.), use in medium scale applications such as light weight roof-top energy for industrial and agricultural power generation, and use in large applications such as a light weight energy source for transportation (automobile, aircraft, barges). The efficiency of the cell would also enable improved power generation in low light conditions. The wide range of spectrum adsorption may also generate power from infra-red light at night time.

Another advantage of using nano or micro cable structures is that the p-n junction associated with each nanocable has a smooth interface that results in a sharper junction. The smoothness is improved at nanoscale as the roughness (measured as rms-root mean square for instance) increases as the scale increases.

It should also be noted that though the axes of the bristles 20 are oriented normal (perpendicular) to the plane of the array in the drawings, the axes of the bristles may be tilted slightly (a few degrees from normal) or pronouncedly (e.g., 40-89 degrees). One reason why a tilted configuration may be desirable is to reduce unimpeded penetration of light into the array when the light is traveling in a direction normal to the array. Pseudo tilting can also be accomplished by controlling the profile shape of the bristles so they are shaped with top diameters or widths being smaller than the bottom diameters or widths, e.g., with a conical or frusto-conical profile, pyramidal or frusto-pyramidal profile, etc., thereby exposing the bottoms to the collimated light of the sun or other light source. Thus, though axes of the bristles may be oriented perpendicular to the substrate, the wider bottom enhances the exposure of the bristles to collimated light.

Figure 3A:
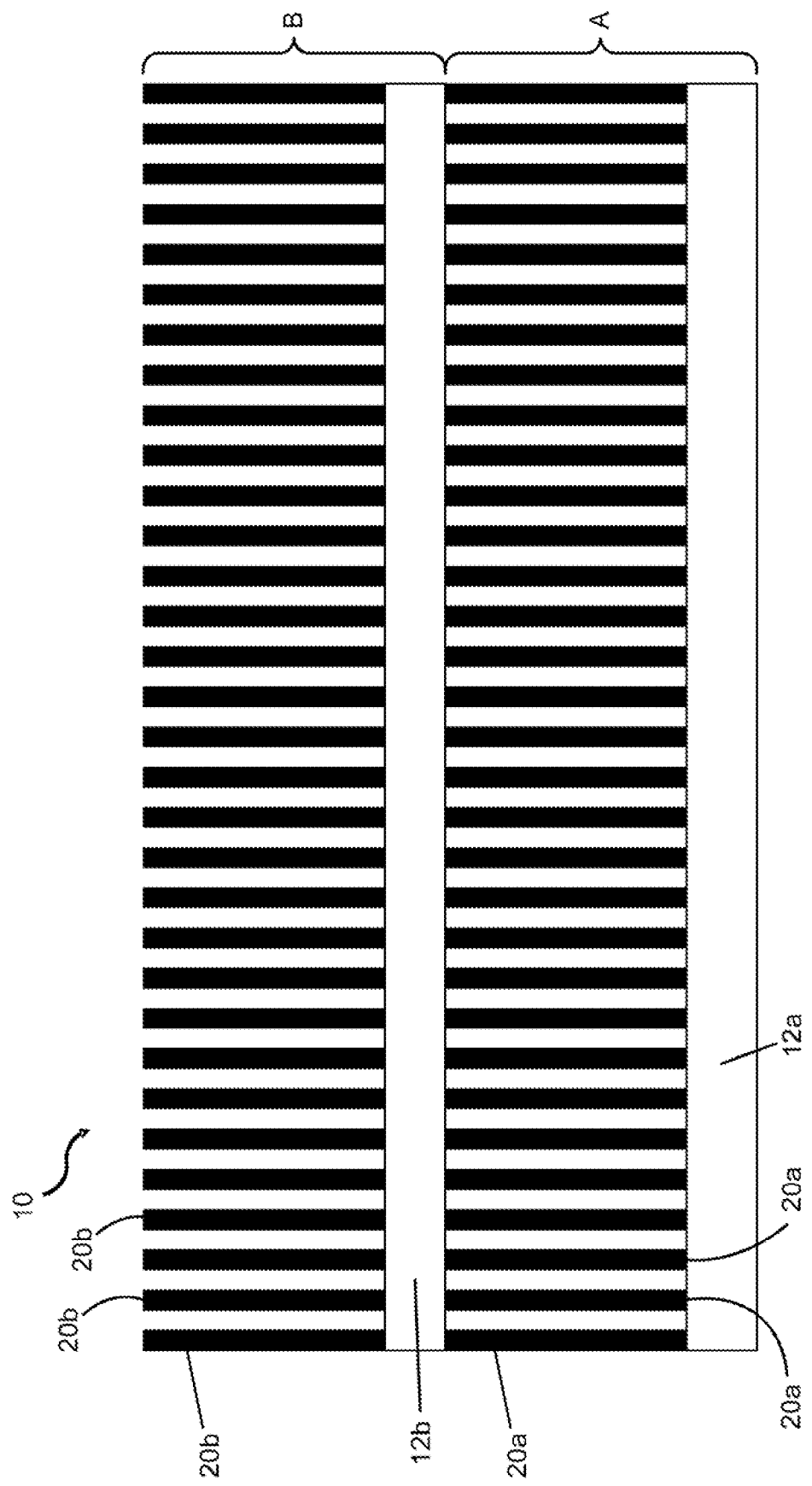

FIG. 3A is a perspective view of the solar brush 10 having a layered structure. The structure in FIG. 3A has a layer A and a layer B, with each layer having a substrate 12a, 12b, the first conductive layer (not shown), the insulator layer (not shown), the second conductive layer (not shown), and bristles 20a, 20b. In the layered structure, the substrates 12a, 12b, the first conductive layers, the insulator layers, and the second conductive layers of one or both layers may be at least semi-transparent so that light can travel between the layers A and/or B. When the solar brush 10 is layered, the bristles 20 do not have to be as densely arranged as in the single-layer structure to achieve the same efficiency. The layered structure can be made using cruder, and therefore less expensive, equipment than the single-layered structure with densely arranged bristles 20. Although the embodiment shown in FIG. 3A has two layers of approximately the same bristle height, this is not a limitation of a layered brush structure. Photovoltaic cells with layered brush structures can contain as many layers as desired to generate the desired efficiency and power.

The layered brush structure can also be used to increase photovoltaic cell efficiency by using a high- and low-band gap material and semiconductor thicknesses tuned for spectral selection. A high band gap material can be used to coat the upper photovoltaic brush, and the low band gap material can be used to coat the lower photovoltaic brush. The upper material would convert higher-energy light to electricity and dissipate much heat. The lower material could convert lower-energy light. This would increase both the efficiency and the life span of the lower brush A.

The layered structure does not need to be made of the same material or by the same process. For example, the upper brush could be produced using a conductive/transparent core of silicone and a silicone substrate made from photolithography and chemical vapor deposition and the lower brush made with organic dye technology. This way, the low-band-gap light can easily pass through the upper layer and reach an organic nanocable base. The base may be made from an anodized aluminum template, carbon nanojacket, and wet polymer process. The layers may or may not have the same dimensions and/or composition. The design need not be limited to two types of photovoltaic cells. A multitude of cells can be included with a multitude of photovoltaic materials so long as each cell has adequate transparency for light to reach the cell below.

FIG. 3B is a side view of another layered structure wherein the average brush heights are different in the two layers. The embodiment of FIG. 3B illustrates that there can be structural differences between the two layers.

Figure 3C:
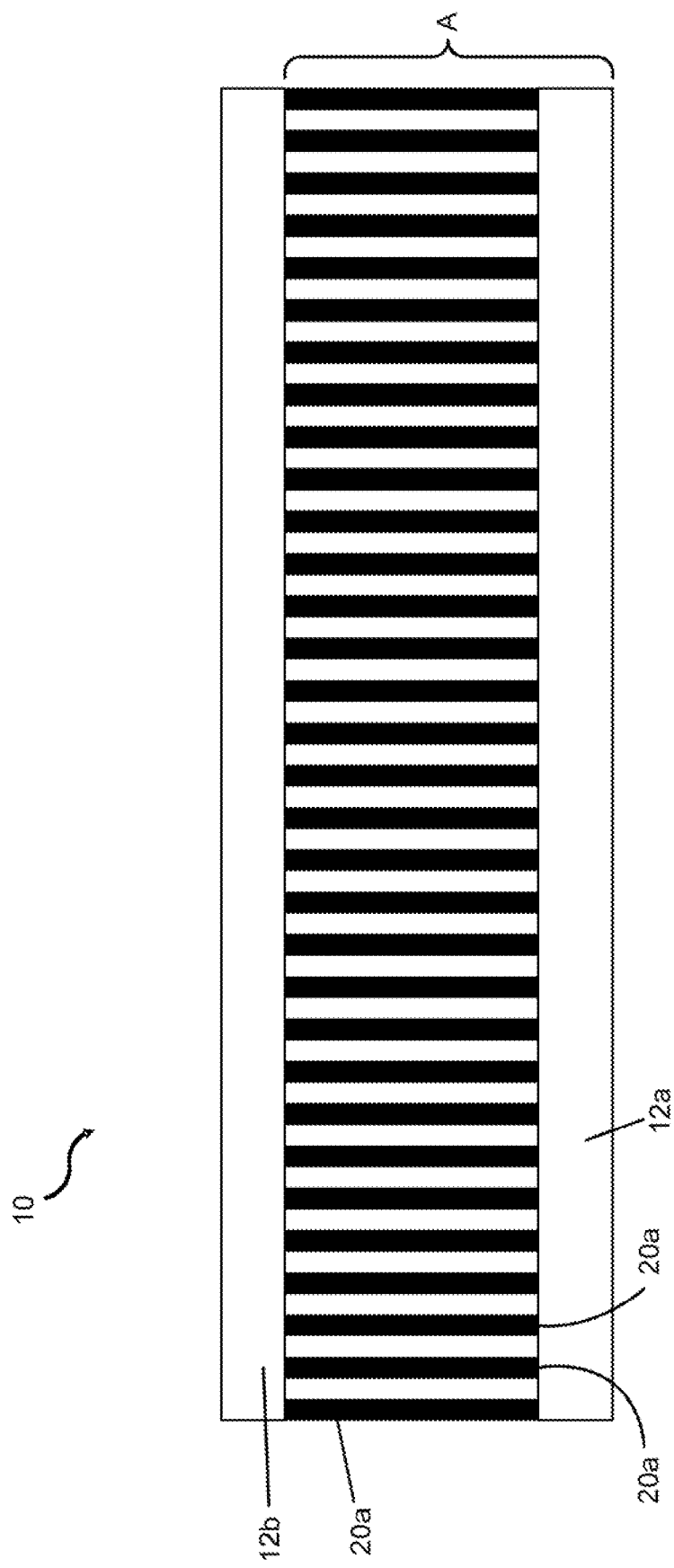
FIG. 3C is a cross-sectional view of a solar brush embodiment employing a thin film planar device as a filter.

FIG. 3C illustrates that a transparent thin film planar device can also be employed as a filter over a brush layer if desired.

Thin, minimal reflectance metals such as gold may be layered along with the n- and p-layers to conduct the current so further gains in efficiency might be achieved.

One benefit over current technology is, as previously mentioned, that the maximum efficiency for a given material can be achieved. Another potential benefit may be achieved by layering material with different band gaps (energies required to excite electrons). The idea is to have a high band gap material such as GaAs (max efficiency ~20%, band gap ~1.4 eV) or CdTe (max efficiency ~30%; band gap ~1.6 eV) at the tip of the bristle and a reduced band gap material further down the bristle such as CIS or GIGS type PV material further down (max efficiency of ~24%; band gap ~0.8 eV). Photons with low energy will not react with high band gap material but will be available to react with low band gap material further down the bristle at further penetration depths. This could be achieved by CVD of CIS material on a nanocable, followed by etching to the top metal core of the nanocable, followed by catalytic growth on top of the nanocable, and the cable would be finished up by electroplating of CdTe/CdS. The solar brush PV cell design could also be a multijunction cell and is a superior architecture for such. Multijunction cells could be easily accomplished by depositing layers of different materials stacked on top of each other. These deposition methods can be diverse and include any method currently used in the art today.

A flexible nanopore substrate can be used as the substrate 12 for deposition of metal. The substrate 12 could be a membrane applied to or constructed on a thin conductive sheet, and may be made into any desired shape. After metal deposition in the membrane pores occurs, the bristles 20 are formed. While other PV tapes and films have XY flexibility and strength, they are limited and no other technology allows for XYZ design of a rigid or flexible long lasting solar cell. The varied geometry of the solar brush allows the PV cells to be optimized for solar exposure from a fixed location, optimal aesthetic appeal, and minimal aerodynamic drag for transportation applications. Specific geometries combined with reflective substrates can effectively produce a combined PV film and solar concentrator.

There are many combinations of materials that may be used for the solar brush 10. One configuration is to use a Si thin film. Other configurations include CdTe/CdS (CdTe/CdS/$SnO_2$/Indium Tin Oxide(ITO)/glass), GaAs/GaInP, $CuInGaSe_2$, $Cu(In_xGa_{1-x})(S,Se)_2$, $CuIn_{1-x}Ga_xSe_{1-y}S_y$, CGSe/CdS, $CuIn_xGa_{1-x}Te_2$/n-InSe, CdS/CIGS interface, ZnS/CIGS, $Cu_2S$—CdS, $CuInS_2$ or a mix of $Cu_xS$, $CuInS_2$ and $CuIn_5S_8$, $Cu(In,Ga)Se_2$/CdS, $CIS/In_2Se_3$, InN, $CIS/In_2Se_3$, $ZnS_xSe_{1-x}$. GaInP/GaAs, GaInP/GaAs/Ge, GaAs/CIS, a-Si/CIGS (a-Si is amorphous Si/hydrogen alloy), $FeS_2$, $Cu_2O$, ITO/a-CNx (Al Schottky thin-film carbon nitride solar cells), and $MoS_2$ based solar cells or more general: MX2 (M=Mo, W; X=S, Se) thin films with Ni and Cu additives layers may be used as well. An $Al_2O_3$ layer may be used as a diffusion barrier with the $CuInGaSe_2$ type PV cells. The manufacturing step may include heat annealing at high temperatures to allow for the consolidation of polycrystalline deposits to form a single crystal material or improve the structural integrity and regularity or geometry of the materials. Alternatively, single crystalline growth of layers should be favored by slow growth of the layers at moderate temperatures. Single crystalline deposits are important for optimum electron transport and photon absorption.

Deposition of the various materials in any of the layers can include one or more of chemical vapor deposition, plasma enhanced chemical vapor deposition, solution phase deposition, electrochemical deposition, electrochemically induced sol-gel deposition, electrochemical atomic layer epitaxy, electroless deposition, e-beam evaporation, sol-gel with electrophoresis or centrifugation, electron beam lithography, scanned probe lithography, pressure injections, polymerization and electro-polymerization, pyrolytic decomposition, vapor transport deposition, sputtering including co-deposition of components, closed space sublimation, thermal evaporation, spincoating, and spraying. Nanocables can also be grown from catalyst sites from chemical vapor deposition, wet or dry etched from a substrate, etc. Additional, optional processing treatments may include anniline to increase Rshunt; $CdCl_2$ additions in liquid phase, vapor phase, and co-deposited with the plating baths or other commons methods to improve Voltage open circuit (Voc); etc. Higher Voc is better because it defines the upper end of the delivered voltage potential.

When designing a PV cell, one of the considerations is the photon flux. The number of photons that make it through the atmosphere at a given point remains relatively constant regardless of modifications in the PV cell that receives them. When determining the appropriate geometry for a PV cell, it is convenient to start by calculating the area of the gaps and the area of the bristle-tops.

Figure 4:
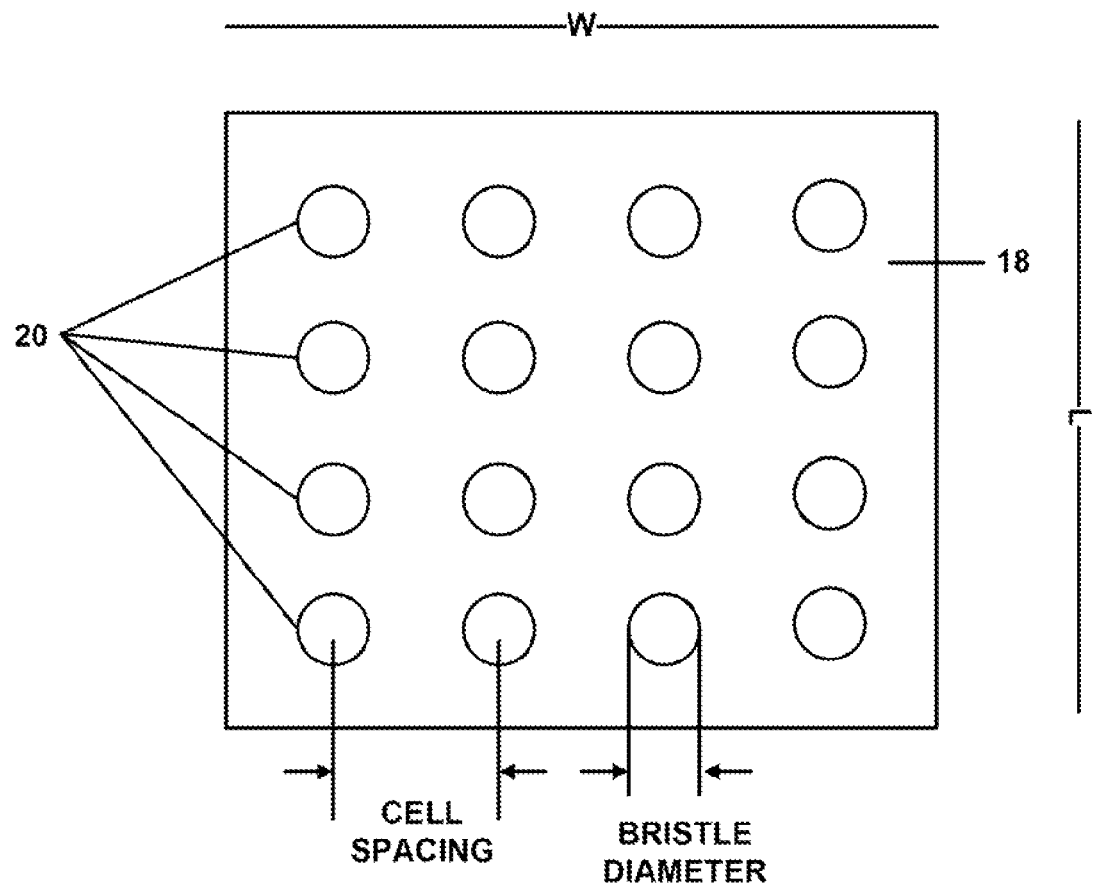
FIG. 4 is a top view of the solar brush showing the tops of the bristles according to one embodiment.

FIG. 4 is a top view of the solar brush 10 showing the tops of the bristles 20. Although the bristles 20 are shown to be arranged regularly, this arrangement can be changed to suit the application. The tops of the bristles 20 have a combined area of $A_{top}$ which is calculated as $\pi(D/2)^2 \rho$ wherein D is the diameter of the bristle and $\rho$ is the cable density (number of cables/unit area). The total area ($A_{total}$) of the PV cell is W×L. The area of the gaps between the bristles can then be calculated using the following formula:

$$A_{total} = A_{top} + A_{gap}$$

During the same calculation, it is useful to determine if the spacing for a given cable density is viable for given geometries. When the diameter of the nanocable 22 ($D_{nanocable}$) is 50 nm, the minimum PV bristle diameter D is about 220 nm. When $D_{nanocable}$=150 nm, the minimum PV bristle optical thickness is about 320 nm. The physical diameter of the bristles 20 will be 100-500 nm larger than the diameter of the nanocable 22, but these numbers should be used for the optical diameter calculations because the outer shell is transparent. The optical diameter is used for calculating the solar efficiency, and the physical diameter is used for determining process limits.

One preferred density ($\rho$) range for nanocables is:

$$\rho = 10^6 - 10^9 \text{ pores/cm}^2 = 10^{10} - 10^{13} \text{ pores/m}^2$$

when using track etched membranes. When using metal oxide templates the density range shifts to:

$$\rho = 10^{12} - 10^{15} \text{ pores/m}^2$$

For the low density case, there is 1 cable per $10^{-10}$ m$^2$, or 1 cable in the center of a $10^{-5} \times 10^{-5}$ m square, so the separation between the center of cables is $10^{-5}$ m or 10000 nm. From that number, the diameter of the bristle from its center axis (which extends through the length of the nanocable 22) to the n-layer is subtracted. The spacing may not smaller than the cable and is preferably larger, so cases involving unrealistic physical spacing were eliminated from calculations in Table 1. Optical spacing, S, is given by the following:

S=cable separation (center pt. to center pt.)−diameter a bristle (semitransparent material)

After Optical spacing is determined, the areas of the top of the PV bristles ($A_{top}$) as well as areas between the bristles ($A_{gap}$) are determined. Table 1 shows that majority of the planar surface area lies within the gaps of the PV cell, not the bristle tops. However, there are design points that have significant levels of top surface area.

TABLE 1

Planar area calculations for the PV brush.

| $A_{top}$ (m$^2$) | $A_{gap}$ (m$^2$) | $\rho$ (#/cm$^2$) | D (nm) | S (nm) |
|---|---|---|---|---|
| 3.00 × 10$^{-4}$ | 0.9996 | 10$^6$ | 220 | 9780 |
| 8.04 × 10$^{-4}$ | 0.9989 | 10$^6$ | 370 | 9680 |
| 3.80 × 10$^{-2}$ | 0.9620 | 10$^8$ | 220 | 780 |
| 8.04 × 10$^{-2}$ | 0.9892 | 10$^8$ | 370 | 680 |
| 1.90 × 10$^{-1}$ | 0.8100 | 5 × 10$^8$ | 220 | 227 |

Planar area and mass per area are crucial to determine back reflection. For planar cells, reflection bounces much of the light out of the PV cell before it has a chance to be absorbed and generate electricity. However, back reflection can benefit the planar cell by bouncing the light off of the back of the cell to give the cell two opportunities to absorb photons from the same stream of light. However, while the back reflection increases the number of absorptive events in the planar cell, it also increases the amount of heat generated per unit volume. In the case of the solar brush 10, only a fraction of the photons that hit the bristle tops can reflect away from the PV cell.

In many cases with the solar brush 10, over 96% of the light falls into $A_{gap}$. Several things happen to the light that falls into the gap: (a) the light is absorbed, (b) the light continues straight through the bristle into the next nearest bristle (as shown in FIG. 2), and/or (c) the light is reflected down into the solar brush at an angle of reflection equal to the angle of incidence. In each case, the light from the gap continues into the bristle. The majority of the light is either absorbed or continues straight through the brush. Back reflection is a function of material thickness as well as material type. Because the solar brush is made up of millions of thin bristles, they become nearly "transparent." Thus, in every case except $\Theta=90°$ (where $\Theta$ is defined as the angle of the sun relative to the plane of the PV cell substrate), back reflection is minimal. If it is assumed that 96% or greater light falls within the gap and each bristle has 90% transparency, then there is a maximum of 0.04% back reflection.

The depth and areas of penetrated light are also calculated. This is a measure of how uniformly the light can be dispersed throughout the PV brush. The penetration of light is governed by the following formula:

$$T_{pen} = \text{penetration thickness} = S \tan \Theta$$

The thickness or bristle height is related to the maximum penetration. The average penetration for a light stream in many cases would be about $\Theta/2$. However, as $\Theta$ approaches 90°, the bottom of the cell could be theoretically flooded with light. However, in reality, this flooding effect is minimal or nonexistent because the light is affected by irregularities in the bristle geometry and can be eliminated by tilting the bristles slightly.

Table 2 shows how deep the light penetrates and what fractional area is used on a first pass by dividing $T_{pen}$ by T, which is the total bristle height. This is a measure of how much the initial light is being diluted. More dilute light leads to lower maximum temperatures or fewer hot spots in the cell, resulting in improved overall efficiency.

TABLE 2

Penetration percentage for a T = 10 μm cell
as a function of sun angle above the horizon

| Spacing (nm) | Θ = 10° Penetration (%) | Θ = 45° Penetration (%) | Θ = 80° Penetration (%) | Θ = 90° Penetration (%) |
|---|---|---|---|---|
| 980 | 17.24 | 97.8 | 100 | 100.00 |
| 9680 | 17.07 | 96.8 | 100 | 100.00 |
| 780 | 1.38 | 7.8 | 44.24 | 100.00 |
| 680 | 1.20 | 6.8 | 38.56 | 100.00 |
| 227 | 0.40 | 2.27 | 12.87 | 100.00 |

Penetration percentage for a 100 μm cell as a function of sun angle relative to the plane of the PV cell substrate is simply 10 times lower. The penetration % is an important design criterion. For transparent cables, if there is 10% penetration, the light will have as few as 10 passes through PV cables, and the average photon would have up to 20 passes through the p-n junction since the photon may pass through the p-n junction twice per bristle. It is probably best to set design criteria to target less than 20% for most of the day to insure adequate absorption opportunities for the light stream. When Θ goes to 90°, tan Θ goes to ∞, temporarily making the penetration level 100%. Optimization, however, will be a function of field testing results.

The total PV absorption area is much greater for the sides of the bristles 20 than for the tops. $A_{cell}$ is the surface area available by PV brush which is given by:

$$A_{cell} = T(\pi)(D\rho/2)$$

where T is the height of the cable, D is the optical diameter of the PV bristle, and ρ is the number of bristles per unit area. The quantity is divided by 2 because it is assumed that most light absorption will come from the sun which is shining on half of the cell at one time. There will be significant absorption events from scattered light as well, but the majority of photons come directly from the sun. Table 3 summarizes some $A_{cell}$ calculations, and shows that the PV cell surface area increases rapidly with denser cell spacing and bristle height. "Cell spacing" is measured from the center of one bristle to the center of its neighboring bristle.

TABLE 3

PV Brush Area Calculations

| Height (μm) | PV Diameter (nm) | Cable Density (#/cm²) | $A_{cell}$ (m² Brush/m² planar) | Cell Spacing (nm) |
|---|---|---|---|---|
| 50 | 220 | 10⁶ | 0.17 | 9780 |
| 100 | 220 | 10⁶ | 0.35 | 9780 |
| 50 | 220 | 10⁸ | 17.28 | 780 |
| 100 | 220 | 10⁸ | 34.56 | 780 |
| 50 | 220 | 5 × 10⁸ | 86.40 | 227 |
| 100 | 220 | 5 × 10⁸ | 172.80 | 227 |
| 50 | 320 | 10⁶ | 0.25 | 9680 |
| 100 | 320 | 10⁶ | 0.50 | 9680 |
| 50 | 320 | 10⁸ | 25.13 | 680 |
| 100 | 320 | 10⁸ | 50.27 | 680 |

The penetration area is proportional to the penetration depth, as shown by the following formula:

$$A_{pen} = \text{area initially penetrated by light} = T_{pen}(\pi)(Dp)$$

where $A_{gap} \gg A_{top}$ the dilution of light is represented by the following formula:

$$A_{pen} = T_{pen}/T \cdot A_{total}$$

From $A_{pen}$ and $A_{gap}$ (Table 1), a calculation that shows the amount of light dilution that occurs in the cell can be made. The light dilution is important to opportunities for solar absorption events and uniform heating. Wherever there are hot spots there is rapidly degrading conversion efficiency. Wherever there is concentrated light that tends to create hot spots, the ratio of opportunities for an absorption event to the number of photons decreases.

TABLE 4

Dilution levels for PV cells when the sun's angle is at 10°.

| Height (μm) | PV Diameter (nm) | Cable Density (#/cm²) | Cell Spacing (nm) | Dilution (times original area) |
|---|---|---|---|---|
| 50 | 220 | 5 × 10⁸ | 227 | 15.23 |
| 100 | 220 | 5 × 10⁸ | 227 | 30.47 |
| 50 | 320 | 10⁸ | 680 | 4.43 |
| 100 | 320 | 10⁸ | 680 | 8.86 |

The inventors have surprisingly found that some embodiments using thin films with small grain size exhibit greatly improved performance. While the precise mechanisms are not completely understood, and without wishing to be bound by any particular theory, the inventors provide the following hypothesis based on laboratory observations and modeling. It is believed that such embodiments take advantage of quantum confinement. Particularly, the architecture of some embodiments allows quantum confinement to be a controlled process. While the exact nature of quantum confinement is not completely understood, and without wishing to be bound by any particular theory, the behavior of the photovoltaic mechanisms is enhanced when quantum confinement occurs. For example, more than one electron per photon may be obtained. Moreover, more powerful electrons may be obtained. Each phenomenon will be discussed in turn below.

In traditional solar cells, as well as in some embodiments disclosed herein, one photon goes into the cell, and one electron comes out of the cell (in normal situations, in bulk material). Again, while the exact nature of quantum confinement is not completely understood, and without wishing to be bound by any particular theory, the inventors have surprisingly found that, for particular constructions of nanostructures using very small feature sizes in the range of quantum confinement, more than one electron out can be potentially obtained per one photon in.

In addition, the inventors have surprisingly found that more powerful electrons may be obtained due at least in part to what is referred to herein as the "blue shift" phenomenon. Particularly, as will soon become apparent, the tuning of grain size and film thickness may allow a PV cell to take advantage of higher energy shorter wavelength photons in the blue, violet and near UV range to increase output. In traditional systems, one photon goes into a PV cell and one electron comes out. The electron is of a certain power, called the band gap of that power. Again, without wishing to be bound by any particular theory, it is believed that particular features of the nanostructures described herein allow shorter wavelength, higher energy light in the blue, violet, and near UV wavelengths to reach higher energy electrons surrounding the nucleus of the PV material. The tunability of various embodiments with regards to light wavelength and the blue shift phenomenon is believed to allow power output of about 2.1 electron volts while the standard "red area" is believed to allow only about 1.45 electron volts. In other words, with traditional bulk material, there is one band gap, i.e., one valence electron that is available so no matter what light color comes in, any excess energy is converted to heat. Accordingly, if a red photon comes in that was almost completely matched to that band gap, most of its energy would be used. If a shorter wavelength, higher energy photon came in that has substantially more energy, it would still cause release of an electron, but there would be an energy loss; in other words any excess energy that the blue photon has would be converted to heat. Thinner films and smaller grains create a quantum confinement that make this energy available by allowing the higher energy photons to reach deeper into the valence shell and eject electrons closer to the nucleus that have a higher energy. The higher energy photons may also cause release of two electrons, each of lower energy the sum of which would be more closely matched to the input energy of the higher energy photon. Thus, some embodiments are characterized by a capability to produce more than one electron per photon engaging the array of photovoltaic nanostructures, for one or more of the photons engaging the device when the device is placed in light.

Embodiments which take advantage of quantum confinement generally utilize thin films having a small average grain size of less than about 100 nanometers, preferably in the range of about 1 nanometer to about 60 nanometers. Particularly preferred embodiments include electrically conductive nanocables with small-grain thin films of PV material thereon. The thin films of the constructions disclosed herein result in more conversion effects (events), and more quantum effects. The smaller average grain size and thinness of the films produces better quantum confinements, which allows access to discrete energy levels (versus a single bulk bandgap energy level that would occur with larger average grain sizes). Based on modeling, the inventors have surprisingly found that that instead of the standard one photon in, one electron out, embodiments of the present invention get around 7-20 bounces or passes (pinballing from nanostructure to nanostructure) where the photon may cause release of multiple electrons. Because of the increased number of potential conversion events, use of very thin layers of photovoltaic material is allowed. This is another benefit of such an approach, for both energy conversion and cost savings. Moreover, the smaller grain size allows blue and ultraviolet light to reach electrons of a higher energy level, or eject multiple lower energy electrons. Additionally, small grains break up the bulk lattice structure of the CdTe film, possibly resulting in the confinement of small discrete groups of atoms which virtually eliminates recombination effects due to small lattice structures contained in the smaller grains. This may allow the electron to move through a substantially smaller lattice structure to a grain boundary where is then easily conducted through grain boundaries to the metal rod structure producing electrical current. The presence of many grain boundaries has been considered a detrimental aspect in planar, thicker PV materials in the past, but data suggests that with structures as disclosed herein and more grain boundaries, the device can actually increase the drift velocity of the electrons resulting again in higher electrical current and considerably less recombination.

The thin films with small average grain size may be employed in any embodiment disclosed herein and the many permutations thereof, as well as in those described and inherent in U.S. Pat. No. 7,847,180, U.S. patent application Ser. No. 11/466,416, and U.S. Patent Appl. Pub. No. US-2010-0319759-A1, which are herein incorporated by reference. It is presently unknown whether the noted quantum effects would occur in planar embodiments, though such embodiments are not foreclosed. It is possible that planar films may not provide the noted quantum effects because the film may be so thin that when a photon comes in it might just bounce out and not be absorbed. Regardless, formation of the layers on a nanocable provides several benefits such as stress relief, fewer defects, enhanced absorption and quantum effects due to multiple photon bounces, etc. Moreover, construction on a nanocable reduces recombination versus a planar substrate as well because in a nanocable, the junction is much closer to the conductive core. Lower recombination may be highly critical to the performance of the cell according to one embodiment, because it allows the device to sustain necessary voltage and current levels for high performance with lower incidences of the electrons recombining and the cell thus losing the energy to heat. In addition, the nanocable-based construction increases reflectivity, which increases the opportunity for the photon to create a PV event as it bounces between the nanorods.

Preferred thin film thicknesses (e.g., deposition thicknesses) of all films, and/or of those thin films formed over the nanocables, are less than about 1000 nm (where "about X nm" means "X nm±10%"). Illustrative embodiments have thin film thicknesses in the range of about 100 to about 500 nm, more preferably in a range of about 100 to about 300 nm. Preferred average grain sizes of at least one or more of the PV layers are less than about 100 nm, preferably between about 1 and about 60 nm, more preferably about 5 nm to about 60 nm, etc.

The film thickness to grain size ratio may be tuned to capture a particular wavelength of light. Moreover, some approaches use a mixture of grain diameters to capture multiple spectrums of light. For example, larger grains may be used to capture longer wavelengths of light, while smaller grains are used to capture the higher energy/lower wavelength photons and produce higher-energy events.

The films may be formed with small grain size by a variety of methods, such as those described below. Particularly preferred methods included pulsed and/or reverse pulse electroplating with a controlled temperature, and sonication of the plating bath. Any PV material may be used in the layers.

Without wishing to be bound by any particular theory, another possible effect to explain the extraordinarily high current results of the thin film structures employed in various embodiments of the present invention relates to the semiconductor junction mechanism known in the art as the "depletion region". The depletion region in some embodiments is believed to extend across the full thickness of the P-type and N-type PV films of the device due to the thinness of the films. This means that some embodiments of the device are believed to behave as an "MOS" or Metal Oxide Semiconductor, and not as a standard thick film absorber PV device. A similar theory has been previously reported through the work of V. G. Karpov et. al. at the University of Toledo. Only now, after the discovery by the present inventors as disclosed herein, can the theory be contemplated as a potential mechanism that may help explain the substantially higher performance of present embodiments.

Without wishing to be bound by any particular theory, the presence of this MOS-type performance is another likely explanation for the superior performance of various embodiments of the nanostructure device currently described. As the CdS layer is thin and the PV absorber layer becomes thin, both become fully depleted. In a practical sense this phenomena may be described as follows: a depletion region forms instantaneously across a P-N junction. It is most easily described when the junction is in thermal equilibrium or in a steady state: in both of these cases the properties of the system do not vary in time; they may be in a dynamic equilibrium.

Electrons and holes diffuse into regions with lower concentrations of electrons and holes, conceptually, much as ink diffuses into water until it is uniformly distributed. By definition, N-type semiconductor has an excess of free electrons compared to the P-type region, and P-type has an excess of holes compared to the N-type region. Therefore when N-doped and P-doped pieces of semiconductor are placed together to form a junction, electrons migrate into the P-side and holes migrate into the N-side. Departure of an electron from the N-side to the P-side leaves a positive donor ion behind on the N-side, and likewise the hole leaves a negative acceptor ion on the P-side. Following transfer, the injected electrons come into contact with holes on the P-side and are eliminated by recombination. Likewise for the injected holes on the N-side. The net result is the injected electrons and holes are gone, leaving behind the charged ions adjacent to the interface in a region with no mobile carriers (called the depletion region). The uncompensated ions are positive on the N side and negative on the P side. This creates an electric field that provides a force opposing the continued exchange of charge carriers. When the electric field is sufficient to arrest further transfer of holes and electrons, the depletion region has reached its equilibrium dimensions. Integrating the electric field across the depletion region determines what is called the built-in voltage (also known as the junction voltage or barrier voltage or contact potential).

Forward bias (in this case the presence of photons), (P positive with respect to N) narrows the depletion region and lowers the barrier to carrier injection. The diffusion component of the current greatly increases and the drift component decreases. In this case the net current is mostly on the N-side of the pn junction. The carrier density is large (e.g., it varies exponentially with the applied bias voltage, which voltage is induced by photons in the case), making the junction conductive and allowing a large forward current. The mathematical description of the current is provided by the Shockley diode equation.

However, in an embodiment with fully depleted P and N materials that comprise the absorber and window layer of the present device, the presence of any photons, including that of merely indoor room light, surprisingly will cause a current conduction event much larger than planar solar cells with thicker films used in the absorber layer which do not become fully depleted due to their inherent thickness, as required for planar structures.

Again, without wishing to be bound by any particular theory, another possibility that can explain the extraordinarily high current that various embodiments produce is a "pseudo-quantum effect". Essentially, the inventors theorize that a similar mechanism to that theorized in the art of quantum dots demonstrating that quantum confinement effects can occur in films or dots that are 30 Angstroms or less in thickness. It is believed that in the case of some embodiments, the nanostructures that may have films that are actually thicker than this number but substantially less thick as compared to planar thin film planar cells, may exhibit a localized quantum confinement effect if the conversion event happens within this 30 Angstrom layer adjacent to the nanorods. This would mean that the distance for the liberated electron to reach the conductive core is within the previously described quantum confinement boundaries. Uniquely when this is combined with the substantially larger surface area presentations that various embodiments of the nanostructure presents to the flux of the sun, much larger currents are possible and have been demonstrated.

The theoretical efficiency limit of PV cells having the thin film layers in combination with vertical nanostructures as described is estimated at about 65%-70%.

In summary, some embodiments of the present invention exhibit the surprising and unexpected phenomenon of one photon in, more than one electron out, and/or one photon in, a more powerful electron out.

FIGS. 6A-6H illustrate an exemplary method for preparing a photovoltaic structure such as a solar brush exhibiting the phenomenon of one photon in, more than one electron out; and/or one photon in, a more powerful electron out. While various layers and steps are disclosed, it is to be understood that this is done by way of example only, and more or fewer steps and/or layers may be used in a particular embodiment.

Figure 6A:
FIGS. 6A-6H illustrate an exemplary method for fabricating the solar brush according to preferred embodiments of the present invention.

Referring to FIG. 6A, a substrate 42 is provided. The substrate may be constructed of any suitable material, such as silicon, glass, metal (e.g., Al, Ni, stainless steel), boron, phosphate, silica glass, polysilicon (i.e., non-monocrystalline silicon) material, etc. For manufacturability, preferred substrates have characteristics that work with typical manufacturing equipment that is used in the semiconductor or flat panel industries. For example, illustrative substrates include 200 mm silicon wafers, 300 mm wafers, 450 mm, flexible substrates, substrates used for flat panel displays of any generation and/or size (such as Gen 2 to Gen 11 flat panel glass as commonly used in modern flat panel televisions), etc.

An optional adhesion layer 44 is formed on the substrate 42. The adhesion layer aids in adhesion of the back plane contact to the substrate. Any suitable material may be used for the adhesion layer. In one approach, a layer of thermal oxide approximately about 100 to about 500 angstroms, preferably about 500 angstroms to about 1500 angstroms is applied to the substrate by sputtering, plasma vapor deposition (PVD), chemical vapor deposition (CVD), or thermal dry or steam oxidation, etc. The surface of the adhesion layer 44 may be roughened, e.g., via Argon sputtering, or RIE sputtering with any suitable inert gas to promote adhesion of the back plane contact thereto. Preferably, about 15 to about 20% of the total thickness is altered by the roughening.

Figure 6B:

Referring to FIG. 6B, the back plane contact 46 is added to the structure. The back plane contact 46 may be a monolayer or a laminate. Any suitable material or material set can be used for the back plane contact. Illustrative materials include Sn, An, Cu, C, Sb, Au, Ag, Ni, Zn, etc. Alloys may also be used.

In one approach to formation of the back plane contact 46, about 150 to about 400 angstroms of titanium nitride is sputtered onto the adhesion layer 44, preferably without breaking vacuum, in other words, in the same vacuum system so that no oxide interface forms. About 1000 to about 5000 angstroms of aluminum copper alloy (99.5/0.5) is added by sputtering. An optional cap layer, e.g., of titanium tungsten, may be added to prevent oxidation of the aluminum alloy. An illustrative thickness of the cap layer is about 50 to about 250 angstroms. Next, about 500 to about 2000 angstroms of nickel vanadium (93/7) is sputtered onto the structure, alternately nickel silicon of the same ratio could be used or other suitable counter ferromagnetic material. The vanadium/silicon additive or the like has the effect of assisting in the flatness and uniformity of the film by counteracting the ferromagnetic properties of the nickel during magnetically confined sputter deposition.

Figure 6C:
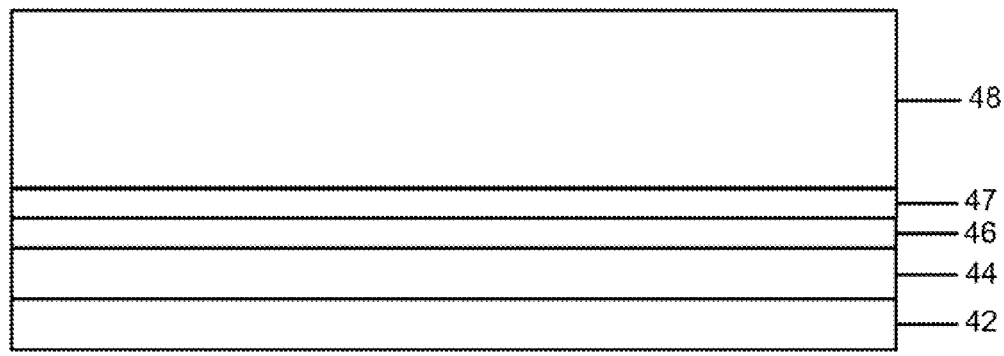
Figure 6D:
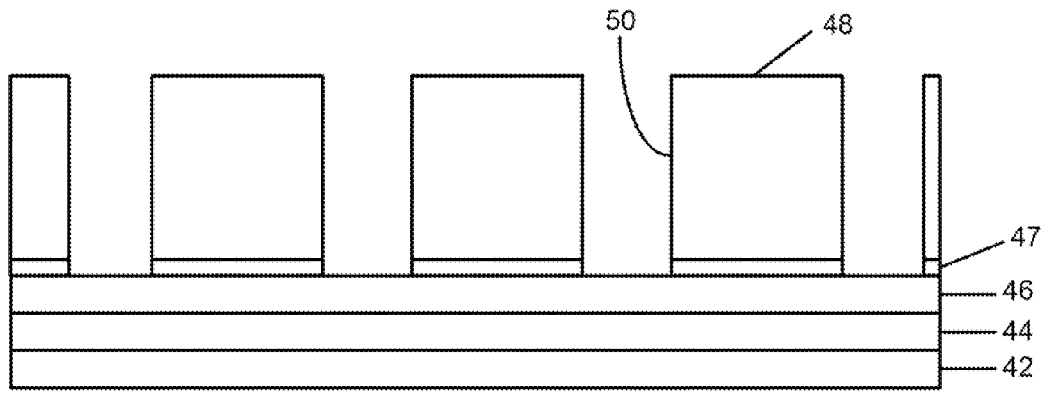

Referring to FIGS. 6C and 6D, a mask 48 is created above the back plane contact 46 using conventional techniques. The mask may be formed of any suitable material, such as a photoresist, polyimide, polymers, a hard mask such as silicon oxide or silicon nitride, etc.

Prior to applying the photoresist, an optional insulating layer 47 may be deposited on the structure. In one approach, about 500 to about 1500 angstroms of a plasma enhanced CVD insulator is applied. The oxide can be any suitable plasma enhanced oxide, such as a tetra ethyl ortho silicate (TEOS), $SiO_2$, SiN, or an Oxy-nitride. Application of the insulating layer is preferably performed using PECVD because of ease of fabrication and the high density and uniformity of the layer. Moreover, CVD does not require additional thermal steps, i.e., deposition temperatures may be low. It is typically undesirable to heat the underlying metal stack because of possible delamination, and the generation of hillocks in the aluminum alloy portion of the back plane contact metal film stack.

In other approaches, no insulating layer is formed between the back plane contact and the mask. This could allow the open areas of the array structure to receive PV materials and become part of the active area of the PV device.

Whether or not an insulating layer is formed, a standard positive or negative photo resist may be deposited using conventional techniques. The resist is processed (e.g., exposed and patterned) using standard techniques to create a mask 48 having a field of vias 50, as shown in FIG. 6D. The photolithography process allow creation of a mask that defines the spacing between the subsequently-formed nanocables and the dimensions of the nanocables themselves, thereby providing complete control over all dimensions of the array of nanocables. Additionally, the aspect ratio (height to diameter) of the nanocables can be controlled by setting the diameter of the vias and the thickness of the photoresist. Thus, by selecting appropriate spacing, diameter, and height, the final device can be optimized to provide the best power output, and potentially using the lowest amount of materials.

If an insulating layer 47 was present, the vias 50 can be extended therethrough by etching, e.g., fluorine oxygen plasma etching, to expose the conductive underlayer.

The exposed conductive underlayer at the bottom of the vias may be sputtered to improve adhesion. Moreover, an oxygen plasma may be applied to make the vias hydrophilic, which aids in the plating step by aiding in proper wetting and proper liquid fill at the bottom of the vias. If the conductive underlayer becomes oxidized, e.g., due to the oxygen plasma treatment, exposure to air, etc., an acid etch can be performed, e.g., by applying a dilute HCl solution for a short period of time.

Figure 6E:
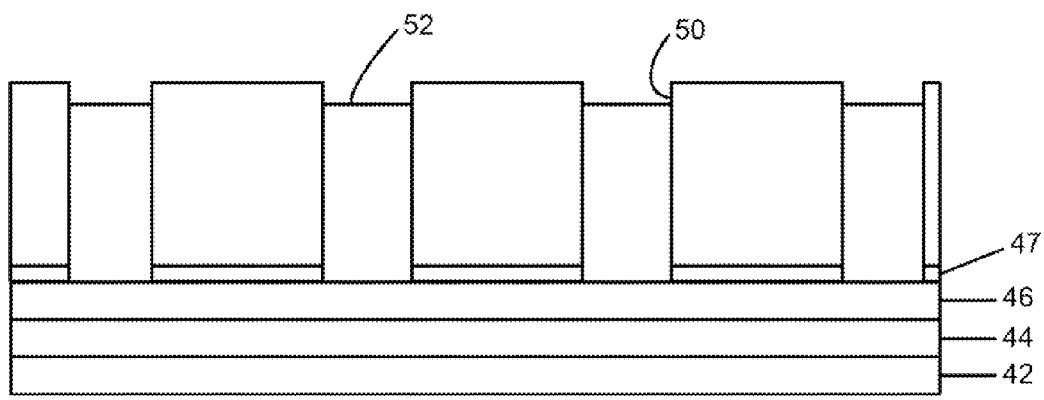

Referring to FIG. 6E, the vias are filled with conductive core material to form nanocables 52. Illustrative conductive core materials may include, but are not limited to, Ni, Cu, Al, Zn, Mo, etc. and alloys of any of the metals with other materials in the list and/or not in the list. For example, illustrative conductive core materials include NiCu, NiPt, NiBi, NiSb, NiAl, and other Ni based alloys; Mo and its alloys; Al and its alloys; etc. In further embodiments, the nanocables may have pure metallic cores formed of any suitable metal and/or its alloys.

The nanocables are preferably formed through electrochemical deposition, though alternatively a combination of electrochemical deposition (ECD), low pressure CVD, and/or sputtering may be used as needed. Preferably, the nanocables do not extend beyond the top of the mask, as overplated material tends to bleed over the top of the mask and connect together. The aspect ratio of the nanocables can be set by an extent of the plating.

Nanocable diameters may vary from about 50 μm to about 0.35 μm, and axial lengths thereof can vary from about 100 μm to about 1 μm typically, but may be larger or smaller depending on a variety of factors including manufacturability, materials constraints, the electrical response of the system based on further dimensional boundary testing with various materials systems previously discussed, etc.

In other embodiments, the fill of the vias can be a multi-material, and each material can have its own benefit. One of the enabling technologies to make an embodiment work efficiently is a back plane contact with the metal stack previously described that is highly uniform and has a low resistivity across the entire substrate. That configuration allows appropriate current densities to be applied uniformly across the wafer, so the growth rates of the nanocables are all even and equal. For this reason, the back metal contact, flow resistivity and uniformity are important to the process.

Figure 6F:
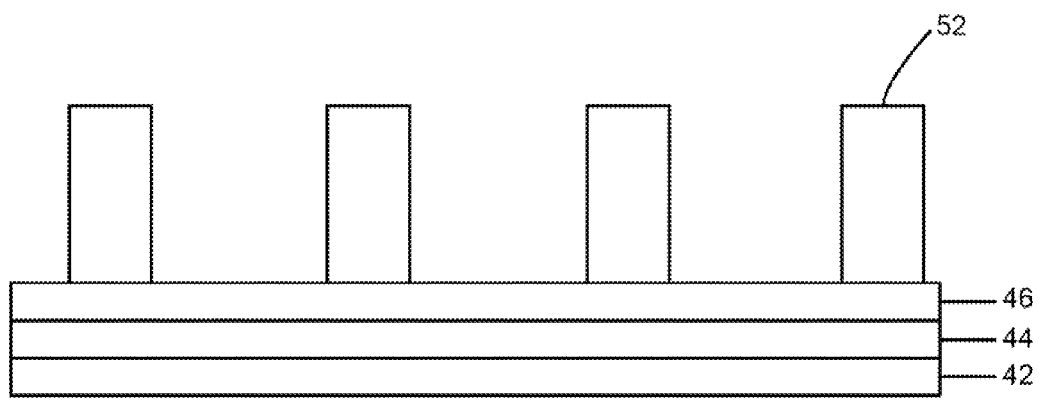

Referring to FIG. 6F, the mask is removed. For example, photoresist can be removed using conventional techniques, e.g., by application of organic solvents such as acetone or alcohol; ozonated water; NMP, TMAH, or proprietary chemicals such Du Pont EKC162; or AZ 400 that are specifically designed for the clean removal of photoresist. After this resist is stripped, a second cleaning may be performed to further clean the structure. In some approaches, alcohol may be used, e.g., isopropyl alcohol, methanol, etc. In other approaches, acidic cleaning of a type known in the art may be used.

As noted above, a back contact layer (not to be confused with the back plane contact 46) may be formed above the nanocables 52, and in some approaches, directly thereon. Such back contact may form an interface between the conductive cores (nanocables) and the layer of PV material closest thereto. The back contact in some embodiments may assist in adjusting the Fermi level and bandbending of the interface to improve Voc for the device and enhance the adhesion of the films to each other.

It is generally desirable to construct a back contact that has a very low electrical resistance, which then enables formation of very consistent nanocables, which in turn enables formation of very consistent films over the nanocables. Particularly, the very low electrical resistance of the back contact allows the subsequent electrochemical deposition process forming the overlying layers to be uniform. If the back contact has a higher resistance, the resulting nanostructures are not quite as uniform, which in turn results in films that are not as uniform. When the films are not uniform, cell performance is degraded, and may include more defects or a variety of other problems. Thus, the more consistent the nanostructures, the better.

A back contact specifically designed to enhance the performance and band bending characteristics to help match electrical work function properties of given materials can be formed using a variety of well know techniques in the art. The back contact layer can be formed from any of a variety of metals and metal alloys, such as those listed herein. Such materials include Sn, An, Cu, C, Sb, Au, Pd, Bi, Te polymers, metal oxides, Si, $SiO_2$, S, NiO, $Ni_2O_5$, $NiS_2$, Zn, $Sb_2Te_3$, Ni, $NiTe_2$, Si, $SiO_2$, Cu, Ag, Mo, Al, Te/C, nitrogen doped ZnTe, or combinations thereof. In some embodiments, CuTe, SbTe, Zn/Te, Sb, Cu, Pd, Au, Ag, Bi, their alloys or laminated layers may be deposited layer by layer discretely or in compound form, using any suitable deposition method including those listed herein. The back contact may be deposited to a deposition thickness in a range of about 1 Angstrom to about 100 Angstroms nominally, though the thickness could be higher or lower. This approach for back contact formation improves Voc and lowers the back contact electron barrier height.

Additional layers are added to the structure, such as the PV layers 54, 56. See FIG. 6G. An illustrative PV layer includes, but is not limited to, II-VI p- or n-type material, III-V p- or n-type material, etc. Particularly preferred materials include CdTe, cadmium sulfide, gallium arsenide, copper indium gallium selenium, amorphous silicon, etc. In further embodiments, one or more of the layers may include CdTe/ZnTe, amorphous silicon carbide a-Si1-xCx:II, micro amorphous silicon, HgICdxTex, gallium nitride, etc. Further embodiments may include CdTe with contamination or low dose dopants therein to improve Voc and/or carrier lifetimes. Such contaminants and/or dopants may include any of the known, compatible highly conductive metals that are commonly in use for PV devices and/or semiconductors. Note that one or more of the PV (or other) layers 54, 56 may include a laminate of layers, a mixture of materials, etc. Moreover, the layers 54, 56 may include the same base element or combination of base elements, or different base element(s).

Photovoltaic devices can include a rectifying junction between p-type and n-type materials.

In some embodiments, the PV layers 54, 56 may form a heterojunction. In one approach, the heterojunction is formed between a semiconductor layer comprising a II-VI compound and another semiconductor layer comprising a III-V compound. A III-V compound in some approaches may be a material with a chemical formula XY, wherein X is selected from a group including boron, aluminum, gallium, indium, and thallium, and Y is selected from a group including nitrogen, phosphorus, arsenic, antimony, and bismuth. A III-V compound in some approaches can be a gallium nitride, for example. The gallium nitride can be a gallium aluminum nitride. A second semiconductor layer may include a II-VI compound or alloys thereof. A II-VI compound can be a material with a chemical formula X'Y', wherein X' is selected from a group including zinc, cadmium, and mercury, and Y' is selected from a group including oxygen, sulfur, selenium, tellurium, and polonium. A II-VI compound can be a cadmium telluride, for example.

One embodiment may further include an interfacial layer that enhances the rectifying properties of the junction between the III-V and II-VI compound semiconductors. Particularly, an interfacial layer can enhance a rectifying junction, such as a rectifying heterojunction between a II-VI compound and a III-V compound. An interfacial layer can include an oxide or doped compositions thereof. The oxide can be a zinc oxide, for example. The oxide can be a mercury oxide. The oxide can be a tin oxide. The oxide can be a doped tin oxide. The doped tin oxide can be a zinc-doped tin oxide. The doped tin oxide can be a cadmium-doped tin oxide. The oxide can be a doped zinc oxide. The oxide can be a cadmium zinc oxide, copper oxide, iron oxide, magnesium oxide, nickel oxide, palladium oxide, silver oxide, strontium oxide, titanium oxide, vanadium oxide, for example. In one approach, an interfacial layer can be positioned between a first semiconductor layer and a second semiconductor layer to form a rectifying junction between the III-V and II-VI compound semiconductors. In another approach, an interfacial layer can be positioned on either side of a semiconductor layer or on both sides of a semiconductor layer. A semiconductor layer can include CdTe for example. Low resistance hole transport between a semiconductor layer and a metal contact or a semiconductor layer and another semiconductor layer can be achieved by using high work function materials.

An illustrative method of manufacturing a photovoltaic device having a heterojunction can include depositing a first semiconductor layer on a substrate, the first semiconductor layer including a III-V compound semiconductor and depositing a second semiconductor layer between the first semiconductor layer and a back metal contact, the second semiconductor layer including a II-VI compound semiconductor. The method can further include depositing an interfacial layer between the first semiconductor layer and the second semiconductor layer to enhance a rectifying junction between the III-V and II-VI compound semiconductors. In one approach, the n-type layer can be covered with a high resistivity buffer layer that may contain doped or undoped transparent oxides such as $SnO_2$, $SiO_2$, $SnO_2$:Cd, $SnO_2$:Zn or $CdZnO_2$. Deposition methods described herein may be used. Additional methods and materials for forming PV structures with heterojunctions, usable in various embodiments, are described in more detail in U.S. Patent Appl. Pub. No. US-2009-0211637-A1 to Eaglesham, which is herein incorporated by reference.

Preferably, the outer PV layer is transparent or semitransparent to allow light to pass therethrough.

Preferably, the PV layers have thicknesses and average grain sizes/size distributions as discussed above and/or below.

Illustrative methods for forming the PV layers include chemical bath deposition, electrochemical deposition, CVD, atomic layer deposition (ALD), sputtering, etc. Moreover, the layers may be doped separately, may include doped/undoped layers, etc. Doping may include ion implantation using twist and tilt techniques as well as diffusion with the injection of various gases, or chemical precursors.

In particular preferred embodiments, each PV layer is formed by electrochemical deposition. Plating can be performed at a variety of temperatures, e.g., about 30 to about 90 degrees C. The plating bath may select as appropriate to provide the desired composition. For example, at least one of the PV layers may be formed by plating p-type CdTe at a bath temperature of less than about 70° C. For CdTe plating in one approach, the bath may include the following constituents:

Te 10 ppm-500 ppm
Cd 10000 ppm-500000 ppm
Cl 50 ppm-1000 ppm
Sulfate molarity 0.001-1.0 millimolar sulfuric concentration.

The electrochemical deposition process for plating any of the PV layers preferably includes pulse plating at various duty cycles. The duty cycle is the entire duration from the beginning to the end of both events, (the on and the off). One approach uses long or short duty cycles with high "on" times (e.g., greater than about 70% on, less than about 30% off, such as greater than about 90% on, less than about 10% off; greater than about 95% on, less than about 5% off, etc.), while another approach uses a long or short duty cycle with an on time of between about 30 and about 70%, while yet other approaches may use shorter on times. In general, it is preferable to use a duty cycle duration and "on" time which, in combination with other plating parameters, provides the desired average grain size.

It is believed that using a duty cycle with 70% or less on time may render a layer with smaller grain sizes. Accordingly, another approach uses long or short duty cycles with shorter "on" times (e.g., greater than about 70% off, less than about 30% on, such as greater than about 90% off, less than about 10% on; greater than about 95% off, less than about 5% on, etc. Again, it is preferable to use a duty cycle duration and "on" time which, in combination with other plating parameters, provides the desired average grain size.

In another approach, reverse pulse plating may be used. Reverse pulse plating is similar to pulse plating but the voltage is periodically swept back in the opposite (negative) direction, causing controlled, periodic deplating of deposited material. The parameters should be set so that more material is deposited than removed, e.g., by making the aggregate of the deposition periods longer than the aggregate of the deplating periods.

Pulse plating, including reverse pulse plating (also known as laminate plating), allows control of nucleation of the deposited material. In one approach, a preferred range for average grain size of the deposited material would be about 1 to about 100 nm.

Moreover, by changing plating parameters, layers with varying average grain sizes can be obtained. For example, a graded layer may be formed, where the average grain size varies along the deposited thickness of the layer. In addition, grains of varying size may be simultaneously formed. Experimental results have indicated that using the techniques presented herein, one can obtain smaller and larger numbers of grains that are not all of about uniform size; rather they vary across a range. Thus, for example, the layer might have 40 nm grains, 70 nm grains, 100 nm grains, and sizes in between.

Sonication, or application of sonic waves to the plating bath, may be applied during plating in some embodiments, and may be used in combination with the pulse plating. The inventors believe that the sonication assists in reducing grain size of the plated material. Preferred sonication techniques use ultrasonic, or megasonic waves in to the plating bath at some selected frequency, stepping between frequencies, or sweeping across a range of frequencies. Particularly preferred frequencies are in the KHz or MHz range.

As touched on earlier, using the techniques presented herein lowers the average grain size, which is believed to assist in improving performance of the layer.

In addition, the inventors also believe that a beneficial band gap shift in the plated material can occur as a result of sonication. While not wishing to be bound by any particular theory, it is believed that sonication changes the electrical constituency of the electroplated film in some way, which in turn allows higher energy electrons to be liberated when the layer is in use as a PV cell. Thus, a beneficial shift in the band gap energy is expected as a result of sonication. It is hypothesized from experimental observations that sonication as a technique by itself may help reduce grains size, and may actually provide grains having a band gap higher than an otherwise identical layer having grains of about the same size but formed without sonication. It is believed that this surprising result will greatly enhance the power output of a PV cell.

The inventors have also surprisingly found that p-type CdTe can be plated. It was previously thought that as deposited p-type CdTe was unplateable. Rather, one prior method plated n-type CdTe, then used thermal treatments to convert the n-type CdTe layer to p-type. However, such thermal treatment increases the gain size, as when thermal energy is applied to reorganize the crystalline structure, the grains tend to grow bigger. In one embodiment of the present invention, p-type CdTe is plated at low temperature. Moreover, the resulting p-type CdTe beneficially has a small average grain size.

Embodiments of the present invention may be tuned to maximize performance. For example, the grain sizes and thickness of each PV film may be selected to work in concert to provide the best performance. Illustrative grain diameters were given previously. A preferred PV single-film thickness range is between about 10 nm and about 1000 nm, e.g., about 50 to about 500 nm, etc., but could be higher or lower in some embodiments. The two PV layers may thus have a cumulative thickness between about 20 nm and about 2000 nm, but could be higher or lower in some embodiments.

The bristles disclosed herein also provide benefits in terms of quantum confinement. Particularly, the apparent film thickness, smaller average grain size, and refractive indices of the various layers are believed to work together to create a quantum confinement effect. Light enters the bristle at various angles, depending on factors such as the source of light, etc. The presentation angle of the bristles to the light determines the apparent thickness of the film that the photon travels through. In other words, how the array is oriented relative to the incoming light creates the first order "apparent film thickness." For example, light coming in at a small angle relative to the longitudinal axis of the bristle sees a larger apparent distance between layers than light coming in perpendicular to the longitudinal axis. The apparent film thickness affects the efficiency of the cell. For example, the maximum efficiency is believed to be achieved when the axis of the bristle is oriented somewhere between parallel and perpendicular to the incoming light. Thus, the initial orientation of the bristles relative to the source of light may be selected to provide an apparent film thickness that maximizes performance.

Moreover, reflection and/or refraction may occur at interfaces of the various layers, resulting in other apparent film thicknesses based on the reflection and/or refraction of the photon once inside the bristle. The reflection and/or refraction can be tuned by selecting materials with a particular reflective and/or refractive index. Thus, every time there is a reflection at a different angle or a different presentation, the apparent thickness of the film to the light is going to be different. Each time the apparent thickness is different, there is a tuning effect based on the wavelength of the light. Accordingly, the quantum confinement and the energy conversion is slightly different for photons entering at different angles, with respect to film thickness. This appears to be independent of grain size. The inventors believe that if the PV films are thin, and the incoming light includes a high frequency, high energy wavelength like violet, the light gets compressed into the thin PV layers resulting in a quantum effect. In areas or embodiments with thicker films, the tuning factor may be more effective for red light. Thus, the combination of presentation angles, material selection, film thickness, and small grain size work as a system to capture the broader spectrum of light, and use it as efficiently as possible. Without the bristle structure and the reflections that occur between the bristles, one would expect not to observe these effects.

The inventors have also observed a surprising change in power output of an array of the bristles according to one embodiment based on theta rotation, or rotation of the array in the plane of the substrate for a given light source location. Particularly, the power output of the array increases and decreases as the array is rotated, including an observable peak power output as the array is rotated. While not wishing to be bound by any theory, it is believed that the unique brush configuration of nanorods and the properties thereof create this phenomenon. Accordingly, one using an embodiment of the present invention may select a combination of theta rotation and initial presentation angle relative to a light source position to maximize power output.

In one embodiment, depicted in FIG. 8, a method 80 of adjusting an array of photovoltaic nanostructures each having a conductive nanocable and PV layers above the nanocable may include rotating the array of photovoltaic nanostructures in a plane of a substrate thereof for increasing an observable power output of the array. See operation 82. In one approach, the array may be rotated in one or both directions to determine which position provides a better or highest power output. Such rotation may be performed periodically, continuously, at predetermined times during the day, etc. In another approach, the time and extent of rotation is predetermined, e.g., set by an installer, and automatically applied at the appropriate times. In some embodiments, the presentation angle of the array relative to a light source position may also be adjusted for further increasing an observable power output of the array. See operation 84. Known devices such as electronics and actuators/motors may be used to perform the rotation and/or angle adjustment.

The foregoing also speaks to the nature of the radial construction, and different films that are present. As noted above, each film also has a refractive index. When light enters an array of bristles, the light is reflected and/or refracted at each one of these film interfaces, which presents a different refractive index for light. Thus, the light is forced to change course and change its apparent presentation to the photovoltaic thickness films themselves. And likewise, the light may bounce out of the bristle and then bounce back in. Without wishing to be bound by any particular theory, it is believed that the variations in the presentation and the orientation of light, and the refractive index values for each one of the films at each interface, correspond to amplification of bouncing and different presentations, thereby allowing different wavelengths of the light to react differently because it is seeing different apparent thicknesses of films. In other words, the films thicknesses are not changing but the apparent thickness varies because of the refractance of the photon is changing.

In addition, the nanorod construction in some embodiments generates multiple reflection events that create a "lightpipe" effect that traps light coming into the top of the nanorods. The tendency of light to be trapped in the nanorod by the lightpipe effect increases efficiency.

Thus, the nanorod structure with stacked films appears to enable different refractive index values that then refract and/or reflect light differently and allow the photons at each wavelength of light to be captured and used at their potential, i.e., conversion events from higher energy photons produce higher output voltages than conversion events for lower energy photons. This phenomenon has been indirectly observed by the inventors, because larger currents and voltages for a certain given surface area have been achieved out of the devices While the precise mechanisms are unknown, the foregoing is believed to explain this surprising phenomenon, at least in part. In one experiment, the inventors observed an output of 48 milliamps per centimeters squared (planar). It is believed up to 20 times that amount is possible.

Figure 6G:
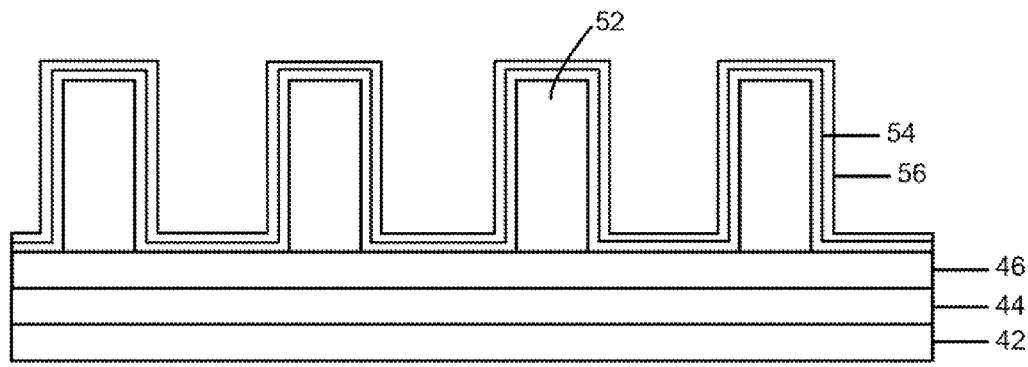

Referring to FIG. 6G, in this example, the n-type PV material 56 is formed on the p-type PV material 54. No adhesion materials are present. However, interface modifications may be performed to make the junction better. Such interface modification may include etching the p-type layer, cleaning the p-type layer, and/or performing various thermal diffusion activation steps. A thermal diffusion process drives the diffusion of the materials across the junction interface boundary to make it a better electrical contact. The etching may deplete the cadmium, thereby allow more tellurium sites to be present at the interface. If cadmium sulfide is used as the overlying n-layer, for example, the sulfur would tend to attract to the open tellurium bonding sites, and drive further into the adjacent layer.

A treatment may be applied in some embodiments to passivate the grain boundary of the p-type or n-type layer. This also improves electrical performance. In one approach, one or more chlorides of the PV material is applied to the layer. For example, $CdCl_2$, $TeCl_4$, etc. may be used. Moreover, consecutive or simultaneous treatments with different materials may be applied. Treatment methods include close space sublimation, direct application, etc.

Figure 6H:
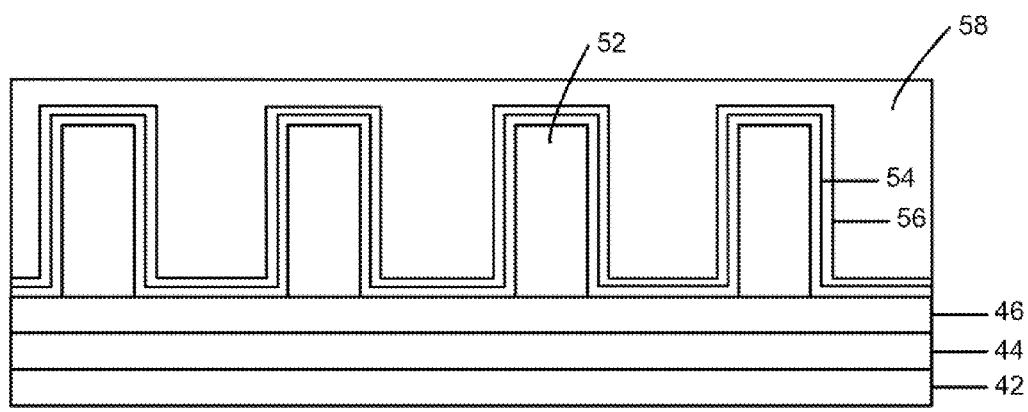

Referring to FIG. 6H, an upper conductive layer 58 is applied over the structure, which can ultimately be coupled to a power lead in a conventional manner. The upper conductive layer can be any suitable conductive film, preferably one that is transparent or semitransparent. Illustrative materials include metal oxides such as zinc oxide with dopant, indium tin oxide, etc.; a transparent conductive oxide (TCO); $Cd_2SnO_4$; etc. The upper conductive layer may be applied full film (as shown) to improve the durability of the array, as a thinner conformal layer, etc. A buffer may also be included. For example, $Zn_2SnO_4$, $TiO_2$, etc. may be added as TCO buffer.

In another approach, an undoped layer having no or little electrical conductive characteristics is applied using any suitable technique such as ALD, CVD, etc. The undoped layer is then doped with a conductive material such as B, Al, Zn, Ga, etc. In one approach, the dopant may be applied during a CVD process as a precursor chemical that is injected through a mass flow control, or a bubbler. Free chemistry in a vacuum system would then incorporate the dopant into the film during the chemical vapor deposition process. Such CVD may be performed at a temperature of less than about 400° C., preferably less than about 200° C.

In one particularly preferred approach, a doped zinc oxide layer is used as the upper conductive layer. Low temperature deposited Zinc oxide has a surface crystal roughness that acts as a diffusion grate or reflective barrier, and a vertical crystal orientation. These help channel photons between grain boundaries, because photons want to interact with reflectant surfaces and tend to funnel through grain boundaries towards the conductive sites. Thus, doped zinc oxide provides reflectants and channeling as well, with preferential channeling of the photons towards the PV layers.

Additional approaches use a doped transparent conductive oxide for the upper conductive layer, such as boron doped zinc oxide, fluorine doped zinc oxide, gallium doped zinc oxide, and aluminum doped zinc oxide. Moreover, other types of conductive oxides may be used, such as indium tin oxide, etc. Transparent conductive layers may also be additionally textured by the nature of the material, its deposition characteristics, method of formation, and temperature, or secondary treatments such as etching or other chemical treatments to further enhance the anti-reflective or light trapping characteristics of the films. These secondary methods are expected to further enhance the light trapping and photon capture efficiency of the nanorod structures in total.

Where a doped layer is used, an undoped layer may be present between the upper transparent conductive layer and the PV layers. This undoped layer may be of the same oxide as the doped layer, but preferably does not contain any of the dopant and therefore will be substantially less conductive.

In a further approach, a passivation layer, such as a charged layer of plasma-enhanced silicon nitride or silicon dioxide, is present between the upper transparent conductive layer and the PV layers. These additional surface films provide charge states to passivate the interface between the n-type PV layer and transparent conductive oxide layers.

In some approaches, PV materials are present on the plane between the bristles. In other approaches, the PV materials are only present on the nanorods. Where photovoltaic material is present between the rods that surface area allows light to be captured. As light is captured, the output of the cell is increased.

It should also be mentioned that the nanorod structure has a natural stress relieving aspect. Thus, one would expect fewer manufacturing defects and minimal delamination events.

One embodiment of the present invention includes a built-in inverter. For example, electronics can be built onto the device to invert the energy from direct current (DC) to alternating current (AC). (State of the art PV devices currently have an inverter that is a separate device that is later soldered to the completed module.) Standard CMOS processing (e.g., masking, implantation, diffusion, depositions, etc.) may be used to create the inverter. In one approach, rather than using the silicon previously described as inactive, the silicon is activated to create the inverter. Thus, each wafer may have its own inverter or set of inverters. In one example, for every square cm of solar collector cell, there is a corresponding inverter structure built into the silicon so that the whole wafer itself is now an inverter. The power coming off of that wafer would pass as AC.

Front side bussing may be used in some embodiments to help gather electricity from the front of the structure. Moreover, contact points to the back conductor may also be provided. Thus, in some embodiments, both the front contact and back contact are accessible on the front of the wafer. Moreover, a lead frame may be used to connect the various wafers in an array of wafers. The lead frame may be a stamped piece of metal that is laid into the module, and contacted with or coupled to the contacts on the front sides of the wafer at the appropriate points to conduct the electricity from both the back contact and the front contact.

In one approach, as shown in FIG. 7, the front contacts 70 and back contacts 72 are arranged in quadrants so that radially the distance of the current flow is minimized to minimize the voltage drop. The back contact itself in some embodiments is a continuous metal layer with a very low resistance at the back of the structure, e.g., the whole back of the wafer is a conducting plane. Thus, holes may be etched to the back contact. The lead frame 74 can be inserted in the holes. On the front of the wafer, front side busses are tied to the appropriate contacts on the wafer. A second conductive portion of the lead frame may be coupled to those.

The lead frame may connect an array of wafers together. The tips of the lead frame may be constructed of any electrically conductive material, e.g., Al, Cu, etc. The tips may be a native metal, and the other areas of the lead frame may be dipped in a resin to insulate them. An edge buss arrangement and a center buss arrangement of lead frames may be used to join multiple sets of wafers together, and the lead frames may be all tied together to form the power out contacts.

In one embodiment, the array of bristles is coupled to a flexible metallic substrate. In one approach, the nanocables are formed in a sacrificial mask similar to that described above. See, e.g., FIG. 6E and related description. However, instead of removing it, a thin layer of nickel oxide (or some other material) is present at the bottom of the via holes to allow subsequent separation of the nanocables from the underlying formation substrate. The nanocables are plated into the vias, and allowed to fill out of the holes to some thickness or depth. The overfill grows together to form a layer that interconnects the nanorods. The photoresist is dissolved, leaving nanocables coupled together by a flexible metal substrate (the overplated material). The nanocables can be detached from the lower substrate because of the thin layer of metal oxide at the bottom of that hole before plating. The resulting structure, when inverted, is a flexible array of free standing solid core metal nanorods. Further processing can be performed on the array, such as addition of PV and other layers. However, the substrate is flexible and metallic. This allows fabrication of such things are flexible PV arrays, e.g., using any of the techniques, disclosed herein and/or other techniques known in the art.

Figure 5A:
FIGS. 5A-5H illustrate an exemplary method for fabricating the solar brush according to one embodiment.

FIGS. 5A-5H illustrate an exemplary method for preparing the solar brush 10 including a metal substrate and bristles of CdTe and CdS. As shown in FIG. 5A, a substrate is prepared by sonicating with ultra pure water (e.g., 18 MΩ) and ethanol in an alternating manner. For example, a metal substrate may be sonicated with ultra pure water for 10 minutes, then with pure ethanol for 10 minutes, and this water-ethanol cleaning cycle may be repeated two more times. If desired, the cycle may be performed more or less than three times and/or an initial detergent-water, acid-water cleaning, or NaOH/NaCN/detergent electropolish process could be added. The type and amount of cleaning that is appropriate will be a function of how clean the substrate 12 is to begin with, and the type of material the substrate 12 is made of.

The substrate 12 may be a conductive material (e.g., metal) or a nonconductive material (e.g., glass or polymer) that is coated with a conductive layer.

Figure 5B:

FIG. 5B illustrates the substrate 12 coated with the first conductive layer 14 that serves as the p-layer conductor in the PV cell. The first conductive layer 14 may be any well-known conductive material deemed suitable by a person skilled in the art, including but not limited to gold, copper, nickel, molybdenum, iron, aluminum, doped silicon, and silver. In one embodiment, a 500-nm layer of gold is evaporated on a glass substrate at 0.2 Å/s using an electron beam evaporator at a pressure under $5\times10^{-6}$ mbar at room temperature. In other embodiments, electroless plating is used with copper salts or $Na_3AuSO_3$ dissolved in 50 mM $H_2SO_4$. After metallization of the substrate 12, the surface of the first conductive layer 14 is rinsed with ultra-pure water (e.g., for 1 minute), rinsed with ethanol, and dried with nitrogen.

Figure 5C:
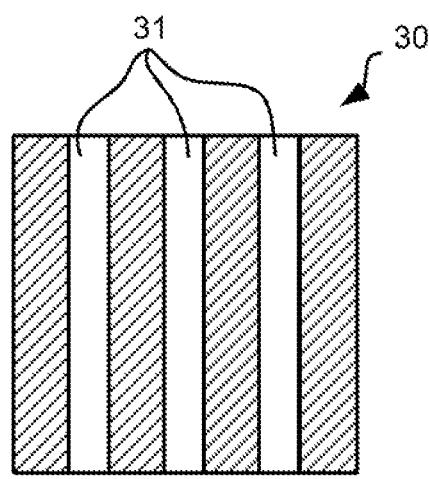

FIG. 5C illustrates a template 30 that may be used to form the bristles 20. The template 30 may be a membrane or porous structure that can be constructed on a conductive base. Selection of the membrane 30 depends on the particulars of the PV cell that is being fabricated. Different p/n combinations have different thickness requirements and therefore different cable size requirements. A membrane can be formed by first depositing a thin conductive material such as 200 nm Ni, followed by depositing an insulating layer such as 200 nm $SiO_2$ or $Si_3N_4$, spin coating approximately 3-20 μm of polyimide or photoresist polymer, optionally layering on a thin metallic or oxide hard mask, and another photoresist. Alternatively, the template can be made with an embossible material. Alternative, a template can be made by filling in a structured substrate with polymer and removing the polymer from the substrate such that holes of any number of geometries are produced. Although embossing may be used to go all the way through a material such as the case where $SiO_2$ is applied though CVD to a thin membrane, and the membrane is run through an embossing tool that creates holes through both layers, embossing can optionally be followed with an etch step that cleans out the oxide and improves the geometry of polymer holes. A nano or micro embossing tool that is usually, but not always heated create embossing. First, the hard mask is patterned with holes that are typically 35 nm to many microns using photolithography, then deep etching takes place. The etching is pulsed to in order to allow the waste stream to leave the via. The upper photoresist is removed while the via is being formed. After the via is formed to the insulating layer, a polymer coating possibly fluorinated polymer can be added to the via prior to etching through the insulator. After the insulator via is etched, oxides on, the conductor should be removed. For metals such as nickel, an HCl solution or 100:1 HF or reactive H+ should be used to remove the oxide. Environmental care or immersion in water should be done prior to electrochemical deposition. In all cases, surfaces with minimal oxide levels are critical for good adhesion of electrochemically deposited nano or micro cable. Before electrochemical deposition, the gas bubbles expelled from the pores by submerging the membrane 30 in water and sonicating for 5 minutes. The back contact can be etched, scribe, laser ablated and the like to form discrete areas on the cell to avoid defects in one area if the cell to affect others. Separate rows can be bussed or combined with metal and dielectric deposition so that any number of rows can be isolated for plating. One could produce one row CdTe and one row CIS type product. Furthermore, a basket weaving type of deposition can create an array where every other bristle has an alternating thickness and composition. Next a transparent conductive oxides are applied, such as F:SnO. Etching can be performed so that the base of the bristle widens and provides sufficient curvature to allow for deposition techniques such as sputtering and CVD of high aspect ratios. Liquid transparent conductive oxides (TCO) also exist such that the TCO application is sufficiently hot as to activate the photovoltaic cell. Alternatively, a membrane can be continuously produced using cylinder with metallic posts that has polymer sprayed on it such as those membranes created by 10X Technologies. Another alternative would be to emboss a thick polypropylene film using conventional embossing techniques like those employed by paper and diaper manufacturers. If the membrane is sufficiently thick, it is possible to heat the top while cooling the substrate, then applying a force through a squeegee, doctor blade, air knife, and the like the cause the pores in the membrane to tilt.

Alternatively, a membrane can be continuously produced using cylinder with metallic posts that has polymer sprayed on it such as those membranes created by 10X Technologies. Another alternative would be to emboss a thick polypropylene film using conventional embossing techniques Selection of the membrane 30 depends on the particulars of the PV cell that is being fabricated. Different p/n combinations have different thickness requirements and therefore different cable size requirements. Before electrochemical deposition, the membrane 30 is cleaned and air bubbles expelled from the pores by submerging the membrane 30 in methanol and sonicating for 5 minutes.

Figure 5D:
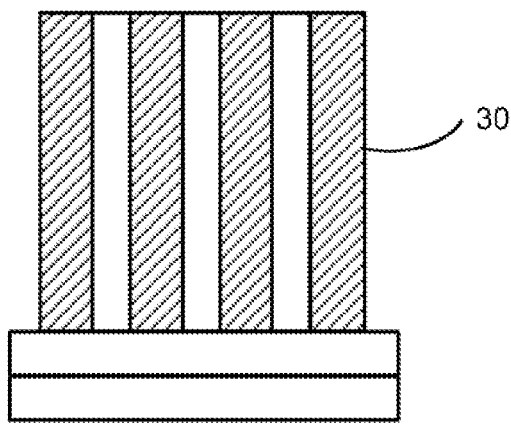

FIG. 5D illustrates the membrane 30 connected to the substrate 12 that has been coated with the first conductive layer 14. There are a number of ways to connect the membrane 30 to the conductive substrate 12 or the metallized nonconductive substrate 12. For example, a $TiO_2$ solution can be used as a conductive glue to fix the membrane to the surfaces. Alternatively, the membrane can be fixed using a Radionics Silver Conductive Paine® . Some substrates require no adhesion. The membrane is simply placed on top of the substrate provided there is good surface contact. Alternatively, the membrane could be attached to the surface with a clamp, using ultrasonic welding, or by fitting the surface and the membrane into a jig.

Final etching through the insulator film may still be required as would oxide removal, in some approaches.

Following the template formation, nano or micro cable can be formed using any number of solutions. Nickel is widely used in MEMS devices and is compatible as a back contact for many PV devices. There is a wide range of commercial nickel baths that are appropriate for the template. Constant potential deposition is generally preferred for precision bristles, but processes can easily be built for constant current deposition as well.

In one approach, after the micro or nanocable is formed the polymer is ashed away using a barrel asher or similar plasma and wet etched to remove residue. Prior to plating the oxide removal process is repeated on the nano or micro bristles to create a high quality back contact. Acidic CdTe plating is performed at a pH of about 1.75, saturated Te from $TeO_2$ and $CdSO_4$ at about 100 times the concentration of the Te. Care should be taken to keep the bath clean and keep any contaminants from the bath. Constant potential deposition of CdTe can be performed anywhere between 60 and 90° C., in other approaches at a bath temperature of less than about 70° C., e.g., about 35° C. to about 69° C. Potentiostats can be easily adjusted between 0.3 and 0.8V to deliver slightly P type CdTe.

After deposition of the CdTe, $CdCl_2$ at about 1% in water or methanol is heated in contact or proximity of the surface at 100 to 500° C. from 30 sec to 45 minutes depending on the thickness of the CdTe and concentration of the $CdCl_2$ treatment. Following CdTe deposition, electrochemical or immersion CdS plating is performed using well known thiourea or thiosulfate baths at 65 to 80° C. Lastly an indium tin oxide or fluorinated tin oxide coating is applied to the cell and the fabrication of the cell is complete. The cell can then be laminated using traditional equipment such as that made by the Spire Corporation.

The cell can be fabricated on a nonconductive, heat tolerant sheet with sufficient room to apply EVA, rubber, or combinations thereof to the surface. The sheet can then be heat sealed to any relatively transparent, impact resistant, and able to with stand environmental damage such as moisture penetration, physical impact, extremes in temperature.

Figure 5E:
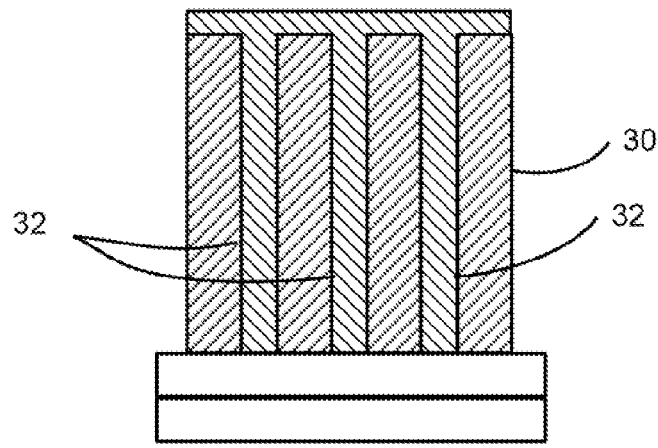

FIG. 5E illustrates the deposition of metal 32 into the membrane 30 and on the substrate 12. In an illustrative plating process, a Sn sensitizer is applied to the membrane 30 through a 5 to 45-minute immersion in 0.26M $SnCl_2$ and 0.07 M trifluoroacetic acid dissolved in a solvent having a molar ratio of 1:1 methanol to water. The membrane is rinsed with methanol. $Sn^{2+}$ adheres to the pore walls and outer surface of the membrane. Next, the membrane is immersed in an aqueous solution of 0.029 M ammoniacal $AgNO_3$ for five minutes. This causes a redox reaction where $Sn^{2+}$ is oxidized to $Sn^{4+}$ and $Ag^+$ is reduced to elemental Ag. Some silver oxide is also generated.

The pore walls and the membrane 30 become coated with discrete nanoscopic Ag particles. The membrane is rinsed with ethanol and immersed in water. Then the membrane is immersed in a 7.9 mM $Na_3Au(SO_3)_2$/0.127M $Na_2SO_3$/0.625 M formaldehyde solution that has a temperature of ~0° C. Gold plating is continued for 10 to 24 hours (time is dependant on pore size), at which time the nanocables are fully formed in the membrane.

An alternative way to deposit materials inside membranes entails using electrophoresis or centrifugation sol-gel methods, electrochemical atomic layer epitaxy, chemical vapor deposition, sputtering, E-beam evaporation, thermal evaporation, electron beam lithography, and scanned probe lithography. Alternatively, well known additives can be dissolved in the solution to impart nanocable strength or better electrical connections to the p-layer conductor. Preferably, metal covers all exposed areas of the membrane, substrate, and fills the pores. After the gold deposition, the membrane is soaked with water and rinsed 4 times over a 3-hour period and immersed in 25% nitric acid for 12 hours to remove residual Sn or Ag. Finally, the membrane is rinsed with water and air dried. Evaporative metal deposition can also take place in the same manner as in FIG. 5B.

Alternatively, the membrane may be placed into the electroless plating solution by itself. The top, bottom, sides and pores become metallized. The membrane 30 may be glued as mentioned above to the metallized substrate 12.

If desired, atomic layer epitaxy may be used to build a protective cover over the membrane 30. Atomic layer epitaxy may be used as an alternative to electrochemical epitaxy.

Figure 5F:
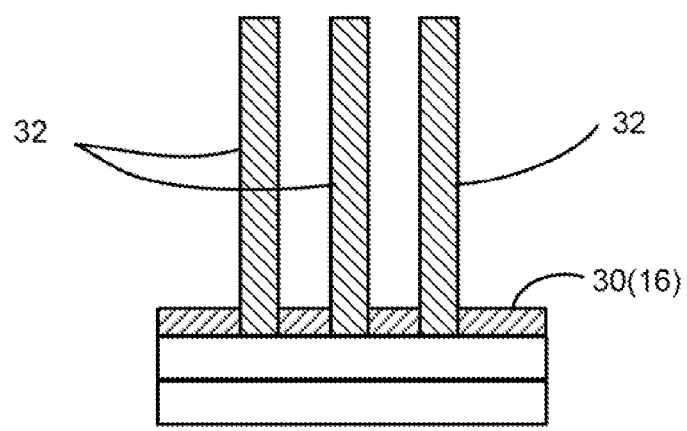

FIG. 5F illustrates the removal of the membrane 30, leaving the conductive cables (nanowires) 32 attached to the substrate 12. Membrane removal is most commonly done by solvent extraction. Partial membrane removal is often desirable. Layered membranes make it easier to achieve uniform partial dissolution. Generally, ashing, RIE or solvent washes are used to remove the polymer or photoresist membrane.

As shown in FIG. 5F, the membrane 30 may be binary in nature so that a solvent or removal technique has a high selectivity towards the polymer or photoresist, but leaves the insulating later intact. Alternatively, the membrane may be completely dissolved and an insulating layer deposited using any suitable method such as spin coating, CVD, etc.

The insulating layer 16 may keep the current from the n-layer and p-layer from short circuiting. The insulator can also limit deposition of PV material to the nanocables. Because insulation eliminates the effects of defects of one cable from affecting its neighbors, processes like electroplating become feasible. Defects are also minimized by reducing the characteristic diameter of the nanocable such that it is significantly below the pinhole diameters to eliminate defects.

Electroplating is a desireable process because of low equipment costs and relatively good material conservation relative to other processes such as sputtering and CVD which deposit material throughout the chamber in addition to in the desired area. The thickness may easily be determined by using various exposure times to dichloromethane and verifying the membrane thickness with scanning electron microscopy.

If all of the membrane 30 is removed, excessive material is consumed. This process may be used if a thinner insulating material or a material other than the material the membrane 30 is made of is desired to form the insulating layer 16. In this case, the desired material may be spin-coated on the substrate 12 with polymethylmethacrolate (PMMA) to a thickness of about 1 μm. The PMMA may function as a membrane glue and/or an insulator. Any insulating material that can be applied to the PV cell be it polymers, silicone dioxide, or any insulator that can have adequate demensional control during application. The PC membrane may be placed on top of the PMMA and baked at around 100° C. for about an hour.

In some embodiments, the insulating layer is eliminated altogether. As long as the p and n layers are adequately produced, direct contact with the conducting layers is possible.

In other embodiments, holes are made in the insulating layer after attachment of the membrane. For example, reactive ion etching (RIE) with oxygen and/or wet etching may be used to drill through the insulating layer 16 to allow the nanocables 32 to connect with the first conductive layer 14.

In other embodiments, membrane can actually be used as a masking layer to etch pores in the underlayer, which is the insulating layer 16 in this case.

Figure 5G:
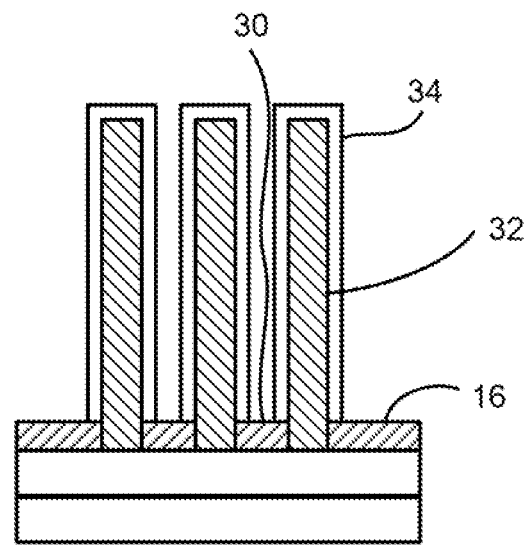

FIG. 5G illustrates the deposition of a p-type semiconductive layer 34. Where the p-type semiconductor is CdTe, for example, the electrochemical deposition is done using 50 mM $H_2SO_4$+1 mM $CdSO_4$+0.1 mM $TeO_2$ solutions by cycling to 95 C and cooling to 72 C. The reference electrode may be Ag/AgCl/3 M NaCl and the counter electrode may be a gold wire. Ultra-pure (e.g., 18 MΩ) water rinses are performed between deposition steps with nitrogen drying. A thin layer of Te may be deposited to prevent Cd diffusion into the nanocable. When CdTe layer is deposited in an electrochemical cell from a solution of 0.5M $CdSO_4$ and $2.4\times10^{-4}$ M $TeO_2$ in water at a pH of 1.6 at 90° C., the optimum deposition potential for a stoichiometric film is varies with the surface plated, but is typically between 300 and 900 mV. CdTe is also known to be deposited in ammonia solutions. Te deposition on the bristle surface can eliminate Cd diffusion into the core of the PV device. The CdTe layer also can be deposited by ECALE (electrochemical atomic layer epitaxy), ALD (atomic layer deposition in chemical vapor deposition system) or sol-gel. When non-electroplating processes such as CVD-related methods are used, etching can be used to remove the p-type layer 24 at the base of the structure to expose the insulation layer and create isolation between the nanostructures.

FIG. 5G also illustrates the deposition of an n-type semiconductive layer 36. Where the n-type semiconductor is CdS, CdS deposition is performed in 1.5 mM $SC(NH_2)_2$, 1.5 mM Cd $SO_4$, and 2 mM $NH_4OH$ heated to a temperature of about 40-70° C. Under these conditions, a 4.5 minute exposure would lead to a CdS layer of about 30 nm. The CdS layer also can be deposited by ECALE (electrochemical atomic layer epitaxy), ALD (atomic layer deposition in chemical vapor deposition system) or sol-gel. Again, when non-electroplating processes such as CVD-related methods are used, etching can be used to remove the p-type layer 24 at the base of the structure to expose the insulation layer and create isolation between the nanostructures.

Figure 5H:
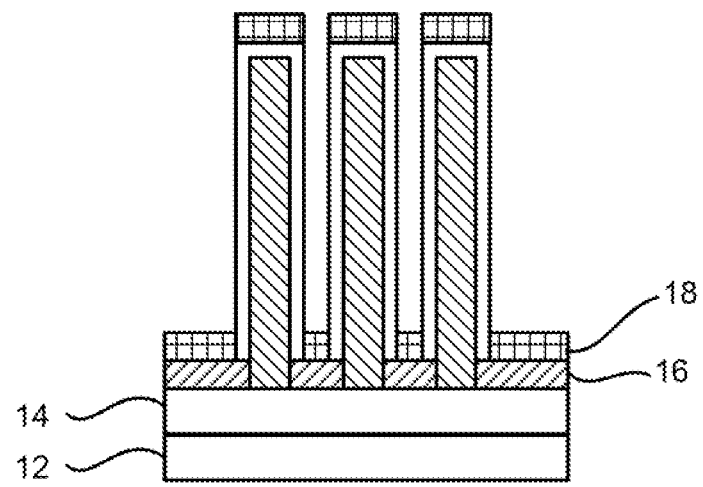

FIG. 5H illustrates the deposition of the second conductive layer 18 that completes the PV circuit. The second conductive layer 18 may be added using atomic layer epitaxy. This deposition connects the second conductive layer to the base of the n-conductors without contacting the nanocable. Alternatively, a thin layer of electroless metal can be coated as in the process illustrated in FIG. 5B as long as the metal remains thin enough to maintain adequate transparency. Yet another alternative is to apply a transparent conductive polymer such as poly(3-hexylthiophene) (P3HT), poly[2-methoxy,5-(2-ethyl-hexyloxy)-p-phenylene-vinylene] (MEH-PPV), poly (phenylene vinylene) (PPV), and polyaniline to the outside of the nanocables to complete the circuit. The polymer could also provide additional structural support. Since the PV circuit is built on the nanoscale, penetration of the polymer may be challenging. For this reason, thinner solutions may be preferred. However, exposing the upper surface of the PV cell would provide adequate conduction. Preferred polymers are light and oxygen stable. Many different conductive polymers are useful to make the electrical contacts and are described in T. A. Skatherin, *Handbook of Conductive Polymers I*, which is incorporated by reference in its entirety.

Additionally, gel electrolytes may be used to make the electrical contact for the p-layer as shown in US2004/0025933, which is herein incorporated by reference. The electrolyte solution could be a combination of poly(4-vinylpyrinidine), poly(2-vinylpyrinidine), polyethylned oxide, polyurethanes, polyamides and a lithium salt. The salt could be lithium iodide, lithium bromide, lithium perchlorate, lithium thiocyanate, lithium trifluormethyl sulfonate, and lithium hexafluorophosphate to name a few.

Although FIGS. 5A through 5H illustrate an exemplary method of fabricating the solar brush 10, there are many suitable variations of the process. For example, an organic photovoltaic material could be used. For example, PV cells could be made based on Dr. Michael Grätzel and co-worker's technology developed at the Swiss Federal Institute of Technology. The metallic core of the nanobristle could be made of metal oxides based on Ti, Zr, Sn, W, NB, Ta, and Tb. The cables can then be coated with an organic dye such as xanthines, cyanines, mercocyanines, and phthalocianines, and pyrols. Many of these compounds have been tested by Konarka Corporation and have been developed for low temperature sintering as illustrated in patent application US 2004/0025934. Fortunately, the nanocable eliminates the sintering concerns and allows the organic compound to be easily applied and efficiently used on the surface of the nanobrush.

Also, any membrane with micropores can be applied to the substrate 12 to produce the PV brush. Also, any metal deposition should work with nanopores be it chemical vapor deposition, plasma vapor deposition, metal organic vapor deposition, electrochemical deposition (electrochemical epitaxy, under-potential deposition), liquid phase epitaxy, molecular beam epitaxy, hot wall epitaxy, sputtering, E-beam and thermal evaporation, electroless deposition, chemical bath deposition, sol gel and solution methods, vapor-liquid solid methods, sonochemistry methods, and microwave methods.

Nanoporous structures of certain metal oxides can be obtained with the metal anodization process instead of, or as a variation of, the method illustrated in FIGS. 5A-5H. Among other systems, Al, Ti, and transparent conductive oxides can be anodically oxidized to form a regular nanopore structure.

In one experiment, tin oxide was anodized. Before electro deposition, a thin Au film was sputtered on one side of the aluminum anodically oxidized (AAO) membrane to serve as the conductive layer. Electro deposition of Sn into the pores of the AAO membrane was carried out at a constant current density of 0.75 mA/cm$^2$ for 1 hour in electrolyte containing sodium tricitrate of 25 g/L and tin dichloride of 7 g/L. The Sn embedded in the AAO membrane was anodized at 10 V in 0.2 M boric acid, whose pH value was adjusted to 8.6 by 0.5 M NaOH(aq). The anodization proceeded until the current density dropped to almost zero. The AAO membrane was then removed through wet etching with 0.5 M NaOH(aq), leaving behind an array of nanoporous tin oxide nanorods. Finally, the samples were calcinated at 500° C. for 3 hours in air.

The bristles 20 may be shaped to increase the surface area. For example, the bristles 20 may have "branches" or holes in the nanocable. Holes may be created by depositing the Cd/Au alloy as just described and anodizing.

Figure 9:
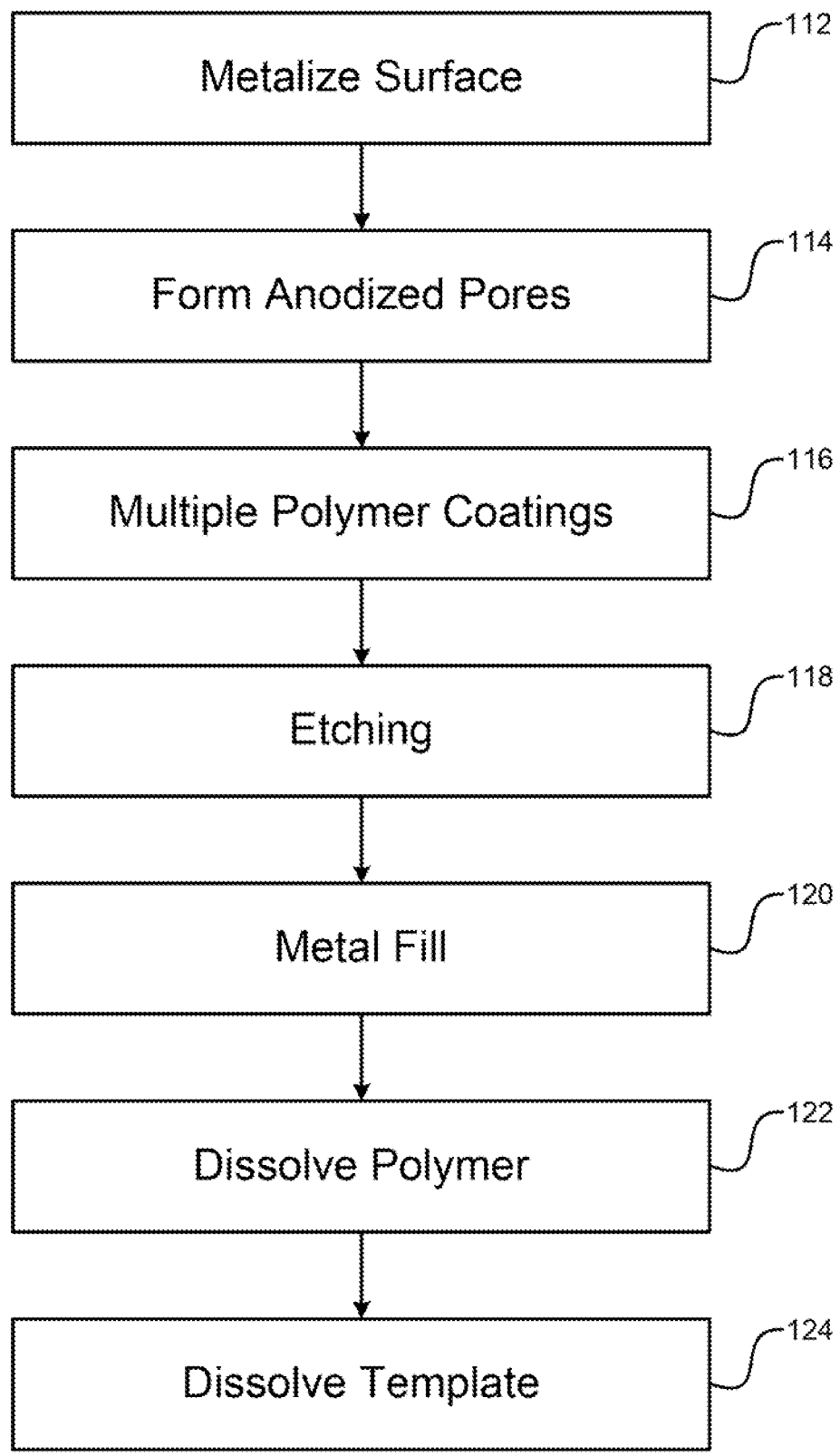
FIG. 9 is a flowchart summarizing the steps of a dimension-controlling process.

FIG. 9 is a flowchart summarizing the steps of a metal reinforcement process according to yet another embodiment. First, the substrate is metallized (step 112) by deposition of a conductive material on its surface. A membrane (a template) is formed on the metallized substrate, and the membrane has a pore of the desired size and shape that is anodized (step 114). One or more polymer layers are deposited and cured (step 116). The polymer layers on horizontal surfaces, such as the top of the template and the base of the pore, are removed by reactive ion etching (step 118). The pore is filled with a core metal such as gold or copper (step 120). Then, the polymer layers are dissolved (step 122) and the membrane is removed by solvent extraction (step 124).

Figure 10A:
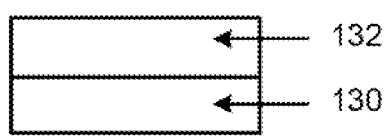
FIGS. 10A-10I illustrate the carbon jacket process for producing organic nanocables according to one embodiment.
Figure 10B:
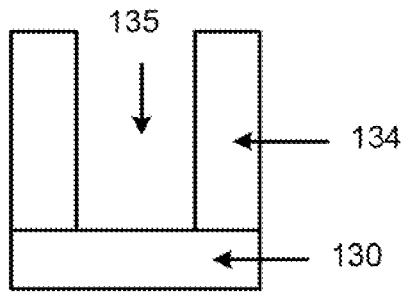
Figure 10C:
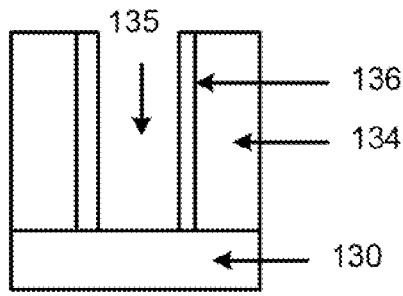
Figure 10D:
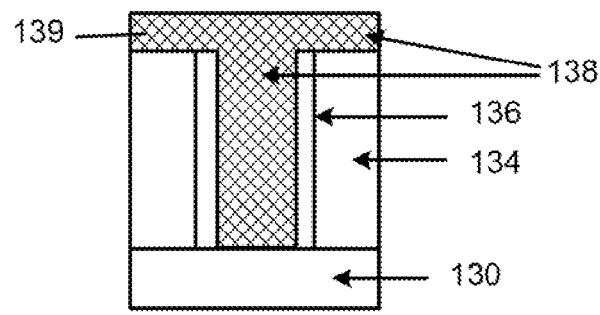
Figure 10E:
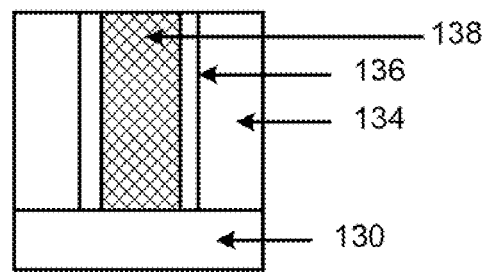

FIGS. 11A-11I illustrate that organic nanocables may be produced using a carbon jacket process. FIG. 10A shows a substrate 130 with a conductive layer 132 deposited on its surface. A metal oxide membrane 134 is formed, wherein the membrane has a pore 135 of the desired shape and size (FIG. 10B). As shown in FIG. 10C, carbon nanotubes 136 are formed on the inner wall of the pore 135, and titanium dioxide 138 is used to fill the remaining core portion of the pore 135 (FIG. 10D). As shown, titanium dioxide 138 fills the pore 135 and "overflows" to form a cap 139 above the carbon nanotube 136 and the metal oxide membrane 134. The cap 139 of the titanium dioxide 138 is removed in FIG. 10E, for example by any suitable etching method such as concentrated $H_2SO_4$ etch.

Figure 10F:
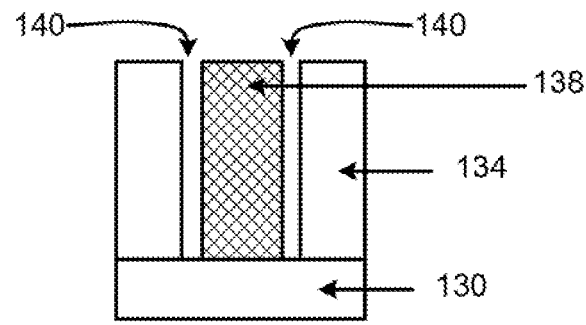
Figure 10G:
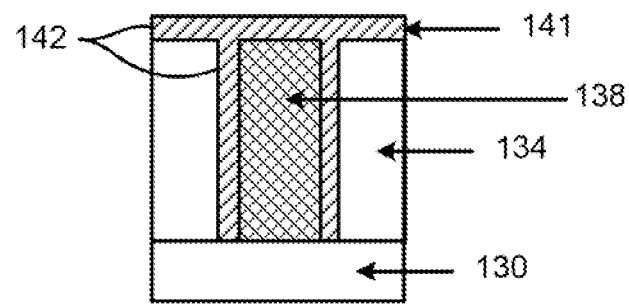
Figure 10H:
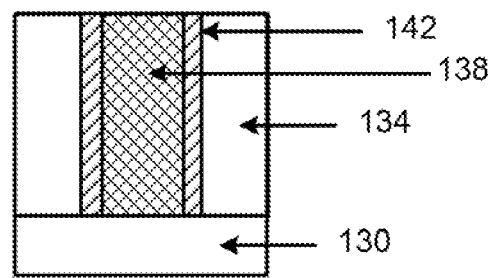
Figure 10I:
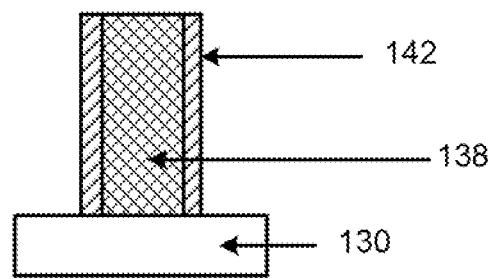

With the titanium dioxide cap 139 removed, the carbon nanotube 136 is burned off by exposure to air at about 600° C. (FIG. 10F), forming a gap 140 between the titanium dioxide core 138 and the metal oxide membrane 134. An organic Grätzel dye 142 is then deposited to fill the gap 140 and form an organic cap 141 (FIG. 10G). Polymers such as poly(3-hexylthiophene) (P3HT), poly[2-methoxy,5-(2-ethyl-hexyloxy)-p-phenylene-vinylene] (MEN-PPV), poly (phenylene vinylene) (PPV), and polyaniline, or any other suitable polymers from *Handbook of Conductive Polymers I* may be used with the Gratzel dye 142 as conductors. The organic Grätzel dye 142 can be sprayed with an inkjet printer, applied with a rotogravure process, sprayed on and wiped with a doctor blade, etc. The most suitable applications leave the minimum organic cap 141. Following this preliminary removal, the organic cap 141 may be etched (e.g., with RIE) or removed with a solvent wash to complete the removal process (FIG. 10H). Then, the metal oxide membrane 134 is removed, for example by wet etching with a carefully selected etchant (e.g., NaOH) that preferentially removes the metal oxide over titanium dioxide (FIG. 10I). In some embodiments, the metal oxide membrane 134 is made to be transparent so that its removal is not needed.

Figure 11A:
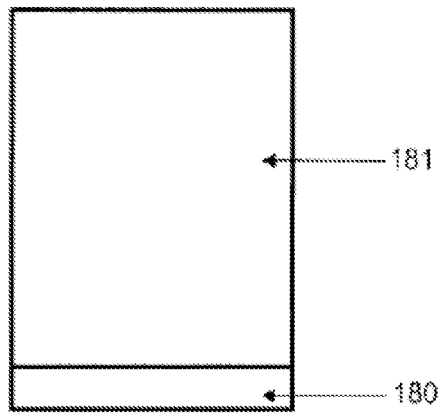
FIGS. 11A-11E illustrate an insulator etching process according to one embodiment.
Figure 11D:
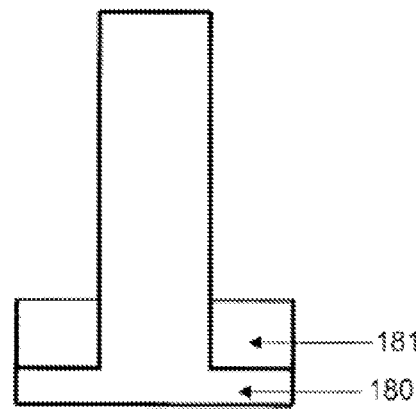
Figure 11B:
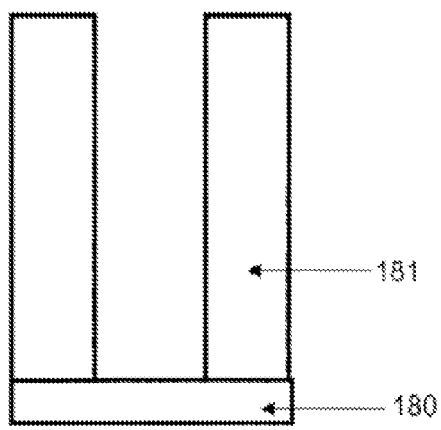
Figure 11E:
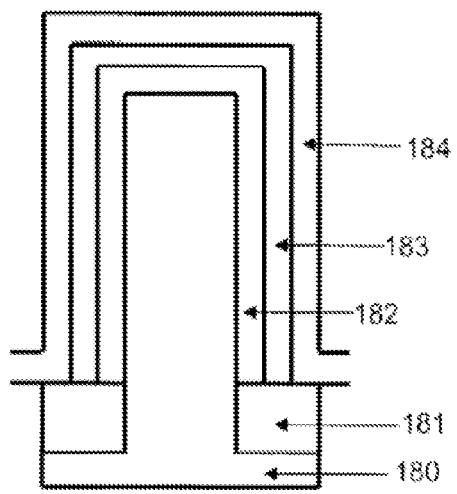
Figure 11C:
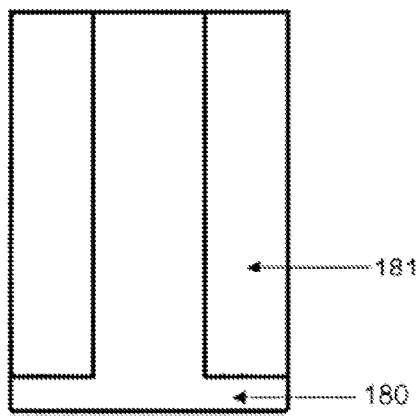

FIG. 11A shows an insulator 181 deposited on a conductor 180. The insulator can be any insulating material such as metal oxide, silicone dioxide, or polymer. The insulator can be applied through CVD or sputtered. It can also be anodically grown from metal deposited on the conductor 181. FIG. 11B shows how the insulator can be wet or dry etched to form a pore that continues through to the conductor 180. FIG. 11C shows that the conductor can then be deposited through electroplating or the electroless deposition methods contained herein. FIG. 11D shows the conductor partially etched. In the case of silicone dioxide, a KOH solution can be used for etching, in the case of polymers, dichloromethane may be used. FIG. 11E shows the completed nanocable with the p-conductor 180, the insulator 181, the p-layer 182, the n-layer 183, and the TCO 184.

Figure 12:
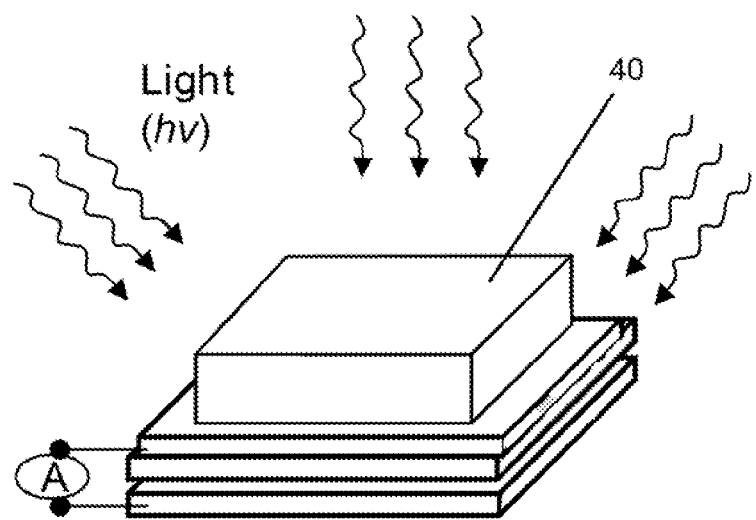
FIG. 12 shows the solar brush encapsulated in an optical casing for protection according to one embodiment.

FIG. 12 shows the solar brush 10 encapsulated in an optical casing 40 for protection from various environmental elements. The optical casing 40 may also be made of a transparent polymer. The optical casing 40 may be made of film conductive oxides that allow light in but minimize soil and moisture contamination. Common materials for this application include Sn doped $Sn_2O_2$, Sn doped $In_2O_3$, $ZnSnO_3$, B doped ZnO. F doped $In_2O_3$, F doped $SnO_2$, F doped $Cd_2SnO_4$, F doped ZnO, TiN, Ag,$Cd_2SnO_4$, Ge doped $In_2O_3$, Ge doped $SnO_2$, Ge doped $Zn_2SnO_4$, ZnO/CdS, ZnO/ZnSe (for CdTE and CuInSe$_2$), ZnO/In$_x$Se$_y$, (for CdTE and CuInSe$_2$), SnO$_2$/glass, ZnO/CdS, $Cd_2SnO_4$/$Zn_2SnO_4$, Zn(Se, OH), Zn(Se,O), and $Cd_2SnO_4$/$Zn_2SnO_4$. For additional conductivity small wires or metal strips or thin bands of metalized glass can be added for additional conductivity. Metal should be minimized to reduce reflection but be sufficient for adequate conduction of electricity. Traditional casing of low-iron glass and extruded aluminum may also be used as in the case of creating a module of a form compatible with cells that could be easily identified and replaced. As mentioned above, there are numerous advantages of the solar brush 10 over conventional PV cells. The solar brush 10 demonstrates a high thermal stability. Unlike nanoparticles, where the linear thermal expansion coefficient increases with the reduction of the average grain size (Cu, for instance), Cu nano-wires show a smaller thermal expansion coefficient than that of the bulk Cu. The high thermal stability is related to the grain boundary structure and high aspect ratio of the nanostructure. Daisy chain connections may also combat potential thermal expansion/contraction issues by minimizing chip size and then connecting them opposed to having a large sheet that would have a higher potential for stress cracking due to thermal expansion contraction. Daisy chains between cells could also add flexibility to a PV brush array. To accomplish this, the cells may have special interlocking mechanism to serve the dual purpose of a being a robust carrier of the film during processing and to speed assembly.

Because the method describes growth of conductors on a conductive sheet, the failure rate that plagues current PV cell manufacturing will be greatly improved giving further cost/efficiency advantages.

A further advantage of the PV brush is that the distance electrons diffuse through the semiconductive layer to the conductive layer is shorter than that of conventional PV cells thereby reducing internal resistance of the PV cells to deliver further power generation efficiencies. Because the PV bristles are thin, they use a small fraction of the material required for planar cells. A variety of organic and inorganic semiconductors can be applied to the conductive core and thicknesses can easily be optimized for power generation and stability.

Besides solar panels, nanoelectronic assemblies can also be used for light generation in optical chips. Optical chips are widely thought to be the replacement for semiconductor chips. Optical chips have narrow pathways that light can travel unhindered while semiconductor chips are limited by electric field effects between on circuit and the next. A micro light source with unique color attributes could be essential for optical chip technologies. The nanoelectric assemblies can also be used as a nanolight source for such chips. Additionally, the nanodiodes can be used in a flat screen display for an ultra sharp video monitor. Additionally, the nanodiodes can be used for very energy efficient lighting.

The PV brush has flexible manufacturing options including membrane manufacturing technologies or photolithography e-beam, low density layered mechanical scoring, nanoporous templated, electroplating, and electrical arcing. These manufacturing methods can be used on a variety of membrane/nanoporous media which allows cell to be shaped and hardened to geometry that has maximum solar efficiency, maximum aerodynamic efficiency, maximum aesthetic appeal or a combination of the aforementioned attributes. Flexible units can also be achieved by daisy chain connection between small rigid units or from the use of a flexible substrate. At high temperatures, uneven thermal expansion can cause cracking and wear as well. High temperature degradation is mitigated because each component of this PV cell can be sized to minimize thermal expansion and can be further optimized with flexible expansion joint conductive connections between PV arrays. Additionally, the greater surface area of the solar brush will reduce thermal heat generated under the PV solar cell compared to the conventional flat unit which could greatly reduce unwanted heat buildup. One further advantage is that micro conductors often have reduced resistance at higher temperatures; therefore, the PV brush could be able to transfer energy more effectively than conventional PV cells at higher operating temperatures.

Finally, the geometry can be used to trap or release heat. If heat were found to be detrimental to energy above a certain point, the unit could be designed with vents. However, it should be noted that performance of nanocables may be different that than large scale wires. While large scale wires/cables have higher resistance to electrical flow at high temperatures, energy flow may improve due to improved flow through grain boundaries in nano-scale structures.

Power generation is a function of average power per day. The median sun hours for various cities in California is 6.18 kW/(day*m$^2$) according to a Go Solar® Company web page at www.solarexpert.com/Pvinsolation.html. On average, solar energy is drawn from about 6 hours per day based on the data made publicly available by National Renewable Energy laboratory findings. The distribution is commonly given as a Gaussian curve, which has the following distribution:

$$f(x) = \frac{e^{\left(\frac{-(x-\mu)^2}{2\sigma^2}\right)}}{\sigma\sqrt{2\pi}}$$

Figure 13:
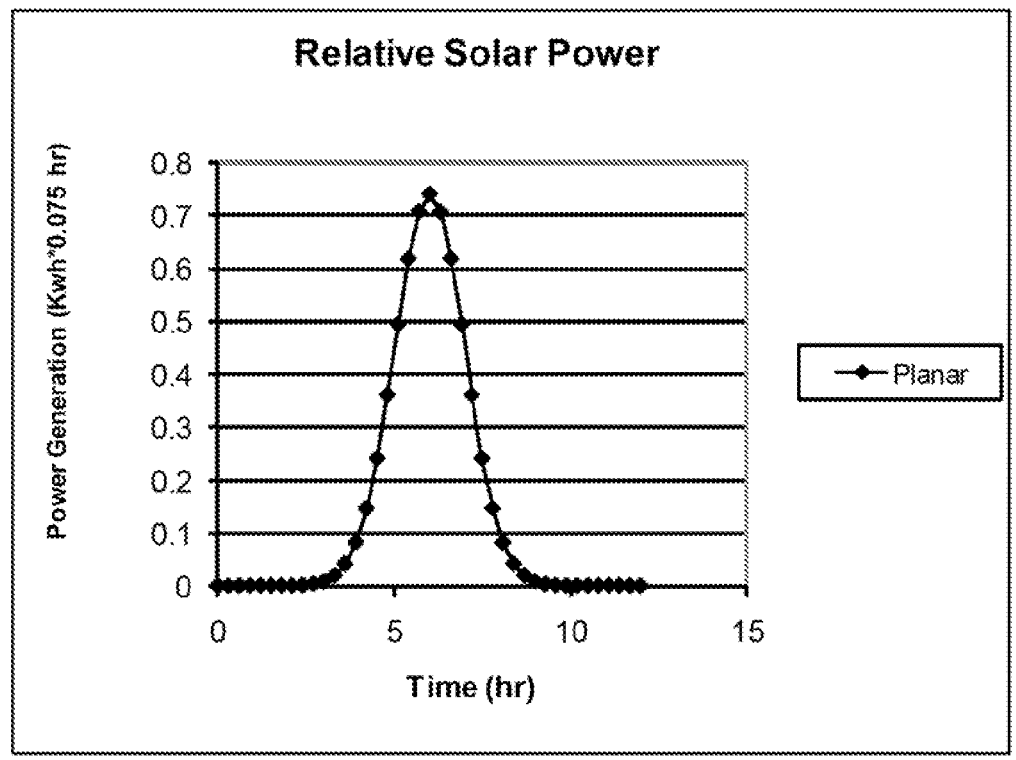
FIG. 13 is a graph showing a potential power generation for a planar solar cell according to one embodiment.

Assuming an average of $\mu=6$ hours, a standard deviation of $\sigma=1$ hour, and integrated power of 6.18 kwh/m$^2$ for an average day gives a maximum energy. When $x=\mu$, the theoretical maximum power generated is about 4.933 kWhr/m$^2$. Based on EU studies of layering, the importance of having each solar event near the p-n junction, and reduced hot spots, the CdTe system may approach its theoretical efficiency limit. Efficiency could get as high as 30% with the single layer systems and potentially higher if we combined a high and low band gap system (discussed earlier). The distributions are shown in FIG. 13.

The power calculation works out as follows:

$P=6.18$ kWh/(m$^2 \times d$) from the mean values for a California city $P_{Brush}=P \times E \times O$ Thus, where E=29 (29% efficiency) for a CdTe/CdS PV cell and O=the orientation gain 1.44 (44% gain), $P_{Brush}=2.60$ kWhr/(m$^2 \times d$) (average day in the mean city in CA).

However, it should be noted that the brush can pick up about a 44.8% gain in efficiency by because it would require little if any sun orientation adjustments. The orientation of the solar brush 10 may have a large effect on performance. Planar PV modules lose up to 44% power from poor orientation and often need to be reoriented using a "solar compass". Due to its unique design, the solar brush 10 does not require reorientation.

If electrical current through the PV device is sufficiently high, a cooling systems that could either be used to generated thermoelectric power (i.e. steam turbine type of power generation) or water heating systems for home use could also be possible.

A majority of the light from the sun is scattered from the atmosphere. Collecting scattered light using the solar brush 10 should lead to even higher energy production. Further energy gains from multi-junction solar cells may bump the efficiency to double what is believed to be currently possible.

The solar brush 10 will probably approach the theoretical maximum efficiency for a given material. Because the brush can be made nearly transparent, most of the light continues to travel through the cell. For practical purposes, the brush would appear to be of ∞ thickness. Because the bristles can be designed just thick enough for stable solar absorption, each absorptive event would happen near the p-n junction. The occurrence of the absorptive event near the p-n junction improves cell efficiency. Another key to improving cell efficiency is to reduce localized heating. Each time there is solar absorption, part of the energy ejects the electron and part of the energy heats the cell. The heating reduces the efficiency of the cell. When cells rely on back reflection, they are also doubling the heat load for a given areas. As the sun moves across the sky, the penetration angle is changing and the trajectory of the solar stream is changing so there is a greater quantity of "fresh" material for the photons to impact. With the solar brush 10, more of the absorption events can be made to occur near the p-n junction through control of the layer thicknesses, and the light stream will pass through greater amounts of PV material. Multiple junction material is believed to be the key to maximum efficiency in the future. Table 5 shows efficiency potential, band gap, and field efficiencies for several materials.

TABLE 5

Efficiencies of photovoltaic material

| Material | Theoretical Maximum Efficiency (%) | Laboratory Maximum Efficiency (%) | Field Efficiency (%) | Band Gap (eV) |
|---|---|---|---|---|
| Single Crystal SI | 27 | 23.5 | 14.0-17.0 | 1.1 |
| Si HIT single crystal | 27 | 21.0 | 15.5-16.5 | 1.1 |
| Si Poly Crystal | 27 | 20.0 | 11.5-14.2 | 1.1 |
| Si Ribbon | 27 | 17 | 11.0-13.0 | 1.1 |
| CIS | 24 | 18 | 9.0-11.5 | 0.9 |
| GaAs | 30 | | | 1.4 |
| CdTe | 29 | 17 | 8.0-10.0 | 1.5 |
| Amorphous Si | 25 | 13.0 | 5.0-9.5 | 1.7 |
| Indium Gallium Nitride | 31* | 17 | 8.5-11.05 | 0.8 |
| Graetzel | 20* | 10.9 | 45 | |
| Polymer | 9* | 4.9 | | 1.0-2.5 |

*indicates that the value is an estimate.

Efficiency compares favorably with current technologies to give the maximum power increases. Table 6 shows the potential energy efficiency and power generation capability in the state of California.

TABLE 6

Potential energy efficiency and power generation in California

| Material | Efficiency | kW * hr/Day/m² |
|---|---|---|
| PV Brush (CdTe) | ~29 | 2.60 |
| Single Crystal Si | 17 | 1.19 |
| Polymer | 2.0 | 0.11 |

Power generation and effective areas for the brush can be significantly boosted through the use of a solar concentrator. A solar concentrator could redirect large areas of light perpendicular to the surface, thereby utilizing the surface area at the depths of the brush. Only light angles close to 90° can penetrate a high area shell. The penetration depth in shown by FIG. 1 is the spacing distance between bristles times tan $\Theta$. As $\Theta$ approaches 90°, tan $\Theta$ approaches $\infty$ and the required penetration level is achieved. The effective area of the solar cell is calculated by dividing the penetration dept by the bristle height and multiplying it by the area. The power output of a high efficiency, high area solar cell in one embodiment is between 50 and 285 kW/day/m² with a solar concentrator. The output ranges compare favorably with the maximum output of 0.94 kW/day/m² based on the best known field results ever for single silicon PV arrays that are produced with a process which is probably much more costly than the methods and structures presented herein.

Table 7 illustrates the power generation for 8" disk PV cells. Reference is made to Table 3, above, for definitions of column headings. Various embodiments of the present invention may have better performance than shown in Table 7.

TABLE 7

High efficiency solar cell power generation for 8" disk PV cells.

| Bristle Height (μm) | Bristle Diameter (nm) | Cable Density (#/m²) | Area (m²/m² planar) | Estimated High Efficiency Power Generation (kWhr/m²*day) |
|---|---|---|---|---|
| 50 | 220 | 5 × 10¹² | 172.76 | 48.06 |
| 100 | 220 | 5 × 10¹² | 345.52 | 96.12 |
| 50 | 370 | 1 × 10¹² | 50.26 | 13.98 |
| 100 | 370 | 1 × 10¹² | 100.54 | 27.96 |

Solar brushes 10 may be made from disks of 12" diameter, or can be grown from any dimension films using oxide templates. They can use existing photolithography and sputtering machines. If an 8" diameter disk is used, it would generate the power equivalent of 0.97 to 5.58 m² planar photovoltaic cells. If a perfect reflector were used in the solar collector, the minimum dish size would range from a diameter of 1.1 m to 14.8 m for full utilization of the PV cell area. Because perfect reflectors do not exist, some of the energy would be lost to absorption and misdirected reflections. A 2 to 25 m diameter may be used to generate the maximum energy. Smaller units can be produced if desired, the size being a function of the power requirements and the installation location. The 8" disk could generate 1.6 to 24.42 kW/day depending on the final area and thickness of material on a disk. The system is also preferably sized to allow proper current conduction without undue system heating of the substrate metal.

The small disk size will allow easy cleaning and reduce efficiency losses over time. Since the area of the central disk is so small, it may be designed to snap in and out to be cleaned in a way that is impractical for larger cells.

The wide range of methods to form nanocables on either flexible or rigid substrate that is shaped to a given specification then hardened impacts the efficiency of the film.

Hard coatings such as TiN, ZrN, or HfN that have melting points around 3,000° C. may be used for certain layers to minimize reflectance or as a reinforcement "jacket" to increase the hardness of the nanocables.

One useful technique that allows improved geometric control of the brush is over etching the bottom of the template so that the bottom of the bristle curves outward. This enables many TCO deposition techniques to be effective. Illustrative TCO deposition techniques include spraying, dipping, spin-on application, etc. That geometry allows bristles to be both taller and placed closer to each other while maintaining a uniform, continuous TCO coating.

TCO may also be applied in a heated liquid form. Accordingly, in one embodiment, the liquid is so hot that the TCO deposition and the heat activation of the cell are combined in one step. In other words, the heat from the TCO activates the PV cells.

Heat activation can also be performed with lasers. One advantage to this is that very little energy is wasted and the carbon footprint is minimized. Often modules are activated in ovens where most of the energy is lost to the environment. Another advantage is that the correct amount of energy is applied to the PV cell. When cells get too much or too little energy, the cell performance is reduced. Finally, the lasers can be pulsed such that some nanocables receive more energy than others. This can be particularly helpful when multiple materials with differing activation requirements are found in the PV array.

Arrays can be patterned is such a way as to leave voids where conductors can be placed on the TCO to reduce the current load on the bulk of the front contact layer. Voids can be patterned also to control the voltage of the module.

Additional methods, configurations, etc. are presented in U.S. patent appl. Ser. Nos. 11/466,411 and 11/466,416, both of which were filed Aug. 26, 2006, and which have been herein incorporated by reference. Any features disclosed in these applications may be used in conjunction with various embodiments of the present application.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method of operating a photovoltaic structure, comprising:
   providing a photovoltaic structure, the photovoltaic structure comprising an array of photovoltaic nanostructures, each photovoltaic nanostructure including:
      a conductive nanocable that protrudes above a plane of a substrate along its respective axis, and
      photovoltaic (PV) layers located above the nanocable and the substrate;
   rotating, while incoming light impinges on the array from a given light source, the array of photovoltaic nanostructures within the plane of the substrate around an axis that is perpendicular to the plane of the substrate;
   determining an optimal rotation angle at which a power output from the array becomes a maximum as a function of a rotation angle during the rotation of the array within the plane of the substrate around the axis that is perpendicular to the plane of the substrate; and
   adjusting the rotation angle of the array to the optimal rotation angle by rotating the array within the pane of the substrate around the axis that is perpendicular to the plane of the substrate for increasing the power output of the array,
   wherein the time and extent of the rotation of the array around the axis that is perpendicular to the plane of the substrate is set by an installer, and is automatically applied at an appropriate time.

2. The method as recited in claim 1, further comprising adjusting a presentation angle of the array, as measured between the axes of the conductive nanocables and the incoming light, for further increasing an observable power output of the array.

3. The method of claim 2, wherein the array of photovoltaic nanostructures is characterized by an observable peak power output as the array is rotated around the axis that is perpendicular to the plane of the substrate.

4. The method of claim 3, wherein the step of rotating the array around the axis that is perpendicular to the plane of the substrate or the step of adjusting a presentation angle of the array, as measured between the axes of the conductive nanocables and the incoming light, is performed periodically, continuously, or at predetermined times during the day.

5. The method of claim 3, wherein the step of rotating the array around the axis that is perpendicular to the plane of the substrate or the step of adjusting a presentation angle, as measured between the axes of the conductive nanocables and the incoming light, of the array is performed automatically.

6. The method of claim 1, wherein each conductive nanocable comprises an interface between at least two refractive layers configured to refract or reflect light.

7. The method of claim 6, wherein rotating the array around the axis that is perpendicular to the plane of the substrate or adjusting a presentation angle of the array, as measured between the axes of the conductive nanocables and the incoming light, changes the apparent optical thickness of the array to incident light.

8. The method of claim 7, wherein changing the apparent optical thickness of the array to incident light amplifies the number of times the incident light bounces within the nanostructures of the array.

9. The method of claim 3, wherein an average grain size of at least one of the PV layers is less than about 100 nm.

10. The method of claim 3, wherein an average grain size of each of the PV layers is less than about 100 nm.

11. The method of claim 3, wherein the nanocables are elongated.

12. The method of claim 11, wherein the nanocables have substantially uniform peripheries and longitudinal lengths.

13. The method of claim 3, wherein the array of nanostructures is characterized by a capability to produce more than one electron per photon engaging the array of photovoltaic nanostructures.

14. A method of operating a photovoltaic structure, comprising:
    providing a photovoltaic structure, the photovoltaic structure comprising an array of photovoltaic nanostructures each photovoltaic nanostructure including:
       a conductive nanocable that protrudes above a plane of a substrate along its respective axis, and
       photovoltaic (PV) layers located above the nanocable and the substrate;
    rotating, while incoming light impinges on the array from a given light source, the array of photovoltaic nanostructures within the plane of the substrate around an axis that is perpendicular to the plane of the substrate;
    determining an optimal rotation angle at which a power output from the array becomes a maximum as a function of a rotation angle during the rotation of the array within the plane of the substrate around the axis that is perpendicular to the plane of the substrate; and
    adjusting the rotation angle of the array to the optimal rotation angle by rotating the array within the pane of the substrate around the axis that is perpendicular to the plane of the substrate for increasing the power output of the array;
    orienting the array to change a presentation angle between the axes of the conductive nanocables and the incoming light;
    determining an optimal presentation angle at which a power output from the array becomes a maximum as a function of the presentation angle, wherein the optimal presentation angle occurs when the conductive nanocables are orientated between a parallel direction to the incoming light and a perpendicular direction to the incoming light; and
    adjusting the presentation angle of the array to the optimal presentation angle for further increasing a power output of the array.

15. The method of claim 1, wherein the conductive nanocables protrude from the plane of the substrate along a direction that is normal to the plane of the substrate.

16. The method of claim 1, wherein the conductive nanocables protrude from the plane of the substrate along a direction that is tilted from a surface normal of the plane of the substrate.

17. The method of claim 1, wherein the steps of rotating the array around the axis that is perpendicular to the plane of the substrate and determining the optimal rotation angle are performed periodically, continuously, or at predetermined times during the day.

18. A method of operating a photovoltaic structure, comprising:
- providing a photovoltaic structure, the photovoltaic structure comprising an array of photovoltaic nanostructures, each photovoltaic nanostructure including:
  - a conductive nanocable that protrudes above a plane of a substrate along its respective axis, and
  - photovoltaic (PV) layers located above the nanocable and the substrate;
- rotating, while incoming light impinges on the array from a given light source, the array of photovoltaic nanostructures within the plane of the substrate around an axis that is perpendicular to the plane of the substrate;
- determining an optimal rotation angle at which a power output from the array becomes a maximum as a function of a rotation angle during the rotation of the array within the plane of the substrate around the axis that is perpendicular to the plane of the substrate; and
- adjusting the rotation angle of the array to the optimal rotation angle by rotating the array within the pane of the substrate around the axis that is perpendicular to the plane of the substrate for increasing the power output of the array,
- employing electronics, at least one actuator, and at least one motor to rotate the array within the plane of the substrate around the axis that is perpendicular to the plane of the substrate, or to change a presentation angle of the array that is measured between the axes of the conductive nanocables and the incoming light.

19. A method of operating a photovoltaic structure comprising:
- providing a photovoltaic structure, the photovoltaic structure comprising an array of photovoltaic nanostructures, each photovoltaic nanostructure including:
  - a conductive nanocable that protrude above a plane of a substrate along its respective axis, and
  - photovoltaic (PV) layers located above the nanocable and the substrate;
- orienting, while incoming light from given light source impinges on the array, the array to change a presentation angle between the axes of the conductive nanocables and the incoming light;
- determining an optimal presentation angle at which a power output from the array becomes a maximum as a function of the presentation angle, wherein the optimal presentation angle occurs when the axes of the conductive nanocables are orientated between a parallel direction to the incoming light and a perpendicular direction to the incoming light;
- adjusting the presentation angle of the array to the optimal presentation angle for increasing a power output of the array;
- rotating, while the incoming light impinges on the array, the array of photovoltaic nanostructures within the plane of the substrate around the axis that is perpendicular to the plane of the substrate;
- determining an optimal rotation angle at which the power output from the array becomes a maximum as a function of a rotation angle during the rotation of the array within the plane of the substrate; and
- adjusting, employing at least one actuator and at least one motor, the rotation angle of the array to the optimal rotation angle by rotating the array within the plane of the substrate for further increasing the power output of the array.

* * * * *